United States Patent [19]
Wilson

[11] Patent Number: 5,212,601
[45] Date of Patent: May 18, 1993

[54] DISK DRIVE DATA SYNCHRONIZER WITH WINDOW SHIFT SYNTHESIS

[75] Inventor: Ronald E. Wilson, Lake Forest, Calif.

[73] Assignee: Western Digital Corporation, Irvine, Calif.

[21] Appl. No.: 695,531

[22] Filed: May 3, 1991

[51] Int. Cl.$^5$ .............................................. G11B 5/09
[52] U.S. Cl. ......................................... 360/51; 360/44
[58] Field of Search .................... 360/51, 40, 44, 60, 360/61, 39, 46, 65, 67, 45; 375/120; 307/527, 52

[56] References Cited

U.S. PATENT DOCUMENTS

| | | | |
|---|---|---|---|
| 4,996,608 | 2/1991 | Widney | 360/51 |
| 5,107,379 | 4/1992 | Huber | 360/46 |

OTHER PUBLICATIONS

Western Digital Corporation Product Specification; WD10C20-05; Self-Adjusting Data Separator.
Western Digital Corporation Product Specification; WD10C21A; Self-Adusting Data Separator, published 1988.
Western Digital Corporation Product Specification; WD10C20B; Self-Adjusting Data Separator, published 1987.
Western Digital Corporation Product Specification; WD10C22B; Self-Adjusting Data Separator, published 1988.

*Primary Examiner*—Steven Mottola
*Assistant Examiner*—Ali Neyzari
*Attorney, Agent, or Firm*—Christie, Parker & Hale

[57] ABSTRACT

A phase-locked system for recovering data from a disk drive includes a phase detector for signalling the difference in phase between incoming delayed data pulses and a phase detection window clock signal. The phase detection window clock signal is derived from one output of a phase shifter driven by the output of a voltage-controlled oscillator whose frequency is controlled by the phase detector. The phase-locked loop is completed by comparing the phase detection window clock signal output of the phase shifter with the incoming delayed data pulses in the phase detector. Data detection window clock pulses, defining time windows in which the delayed data pulses are discerned, are produced at a second output of the phase shifter. The phase shifter produces a delay variable in precise increments over a wide range, causing a variable phase relationship between the time windows and the delayed data pulses that are to be discerned therein.

36 Claims, 12 Drawing Sheets

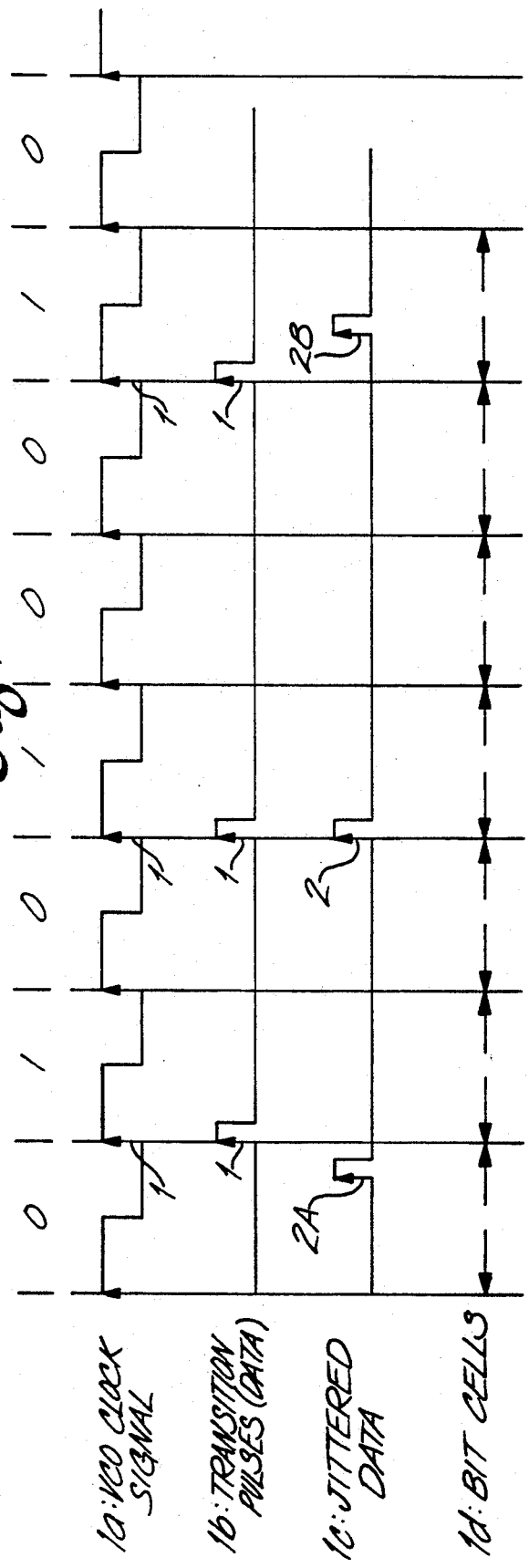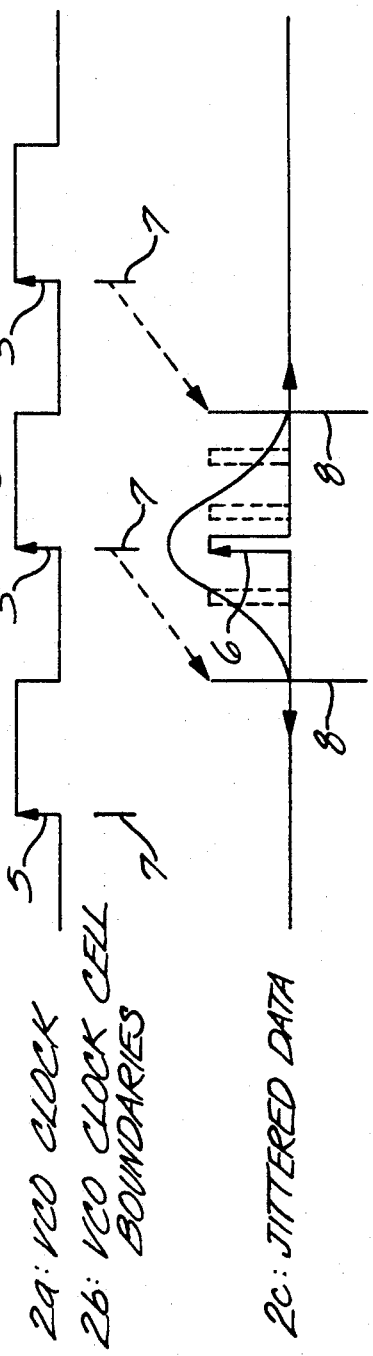

Fig. 9b

DISK DRIVE DATA SYNCHRONIZER WITH WINDOW SHIFT SYNTHESIS

"This application is related to U.S. patent application Ser. No. 07/685473 to Wilson et al, filed Apr. 12, 1991, still pending."

FIELD OF THE INVENTION

This invention is directed to disk drive data recovery systems and, more particularly, to a disk drive synchronizing system having a variable window clock.

BACKGROUND OF THE INVENTION

In electromechanical data storage devices such as a disk drive, data being stored is normally recorded onto a magnetic disk in an encoded form consisting of an irregular pattern of ones and zeros. Binary data being recorded is typically synchronous, in that the sequence of ONES and ZEROS making up the data stream occurs with reference to a data bit cell, defined by a uniform or single-frequency clock signal. Recording the clock signal, together with the data, would take up valuable storage room and reduce the data storage capacity of the disk. Using self clocking techniques well known in the art, synchronous binary data is encoded into patterns of ONES and ZEROS, in accord with specific rules regarding the number of consecutive binary ZEROS allowed before a binary ONE signal is required.

Even though some degree of self clocking is inherent in the encoded data, some method of evaluating the encoded data stream must be used in order that a data recovery system may determine how many ZEROS occur consecutively between ONES. In a typical disk drive data recovery system, this function is performed by a data synchronizer which regenerates a synchronous timing reference signal from the encoded data and synchronizes the encoded data stream to that reference. In effect, the data synchronizer generates a synchronous stream of successive windows in time, each window representing a bit cell (in this case, a code bit cell), with which one or more encoded data bit(s) is/are associated. A time period of no ONES may then be referenced to the windows (bit cells) and the number of consecutive ZEROS extracted. For example, six consecutive windows occurring between encoded ONES means there are six consecutive ZEROS in the code. However, the frequency of a recovered synchronization clock synthesized by the data synchronizer is subject to a number of variations introduced by the electronic and mechanical components of the disk drive system. Mechanical system irregularities, such as motor speed variation, spindle bearing noise, actuator flexure, head resonances, and disk platter eccentricity, typically introduce a low-frequency component to the encoded data stream, resulting in a slowly varying read-channel-data rate, while electronic components in the data path typically introduce elements of phase, frequency and write splice noise which are high frequency in nature and more random in their effect on any particular code bit. This last phenomenon is known in the art as "bit jitter". A data synchronizer must take these variations in encoded data frequency into account when synchronizing the data stream.

Common implementations of a data synchronizer include a phase-locked loop (PLL), normally comprising a phase comparator, charge pump, filter, and a means for generating a synchronous feedback (clock) signal, such as a voltage controlled oscillator (VCO). At the beginning of a data read operation, during what is termed velocity lock, the oscillation frequency of the VCO is determined by, and locked to the frequency of, a pulse train recorded in a synchronization field, provided on the data track for such purpose, and occurring just prior in time to the encoded data stream. Once frequency lock is established, the VCO runs in what might be termed a quasi-flywheel mode at a mean frequency determined during velocity lock. Subsequent correction control of the VCO frequency is developed by phase-locking a transition edge of the synchronous VCO signal to a transition edge of an incoming encoded data pulse. The VCO is phase-locked to the incoming encoded data stream by comparing, in the phase comparator, the phase of the rising edge of a data ONE bit to the rising edge of the VCO clock signal. A phase (time) difference between the two rising edges will cause the charge pump to generate a control signal, directing the VCO to either speed up or slow down in response to a frequency variation in the encoded data stream. However, variations due to bit jitter are random in direction as well as frequency. Speeding up the VCO in response to an early-jittered data bit may result in over-correction, especially if the next data bit is jittered late.

A low pass filter is typically provided between the charge pump and the VCO to reject corrections resulting from random high-frequency variations of individual data bits due to bit jitter, and allow ideally only corrections resulting from consistent frequency shifts of the data stream, such as the slowly time-varying perturbations introduced by the mechanical systems discussed earlier. The VCO is therefore locked to the mean phase of the encoded data, rather than to the phase of a particular data bit. Once phase-locked, the synchronous VCO signal provides a recovered clock whose rate (frequency) is equal to the rate at which ONES and ZEROS occur, or an integral multiple thereof. Given perfect frequency and phase-lock of the VCO clock signal to the encoded data stream, the VCO clock might well be used as an analog to the original synchronous clock accompanying the original write data, serving to mark the boundaries of the encoded data bit cells (code bit cells). Perfect phase-lock of VCO to data, however, is not possible due in part to the rejection, within the low pass filter, of VCO phase correction signals resulting from the effects of bit jitter.

The term "bit jitter" refers to the fluctuations in pulse timing which result from a variety of factors, including magnetic surface flatness variations, non-uniformity of the magnetic properties of the media, uncompensated second order peak shift effects, imperfect peak shift precompensation, media deep magnetization, adjacent track pattern interference, incomplete erasure of previous recordings, and magnetic and electrical component noise; displacement of a pulse due to bit jitter being mostly random in both magnitude and direction. The effects of bit jitter on an encoded data stream are illustrated in FIG. 1. Encoded data pulses (FIG. 1b) have been phase-locked to the VCO clock (FIG. 1a), wherein rising edges of the VCO clock and rising edges of the encoded data coincide. Given perfect phase-lock, the rising edges of VCO clock might serve to define synchronous code bit cells (FIG. 1d); a data pulse edge (for instance, a rising edge) occurring within a code bit cell representing a logic ONE, no data edge occurring within a code bit cell representing a logic ZERO. The pulse sequence, illustrated in FIG. 1b, would therefore be read as 010251. Since phase-lock occurs with respect to rising edges 1, an early jittered encoded data pulse rising edge will necessarily occur before the rising edge of the VCO clock signal defining the beginning of the data pulse's respective code bit cell. Referring to FIG. 1c, bit jitter has displaced one pulse (2a) early, one pulse (2b) late, and one pulse (2) not at all. The early jittered pulse 2a falls outside of its respective code bit cell, into the previous cell, causing the data stream pulse sequence to be incorrectly read as 25251 rather than 010251.

The random nature of bit jitter can be appreciated by referring to FIG. 2. Shifts in the nominal position of a data bit due to timing fluctuations (bit jitter) result in a normal distribution of possible transition pulse rising edge positions, distributed, with respect to time, around the occurrence of the VCO clock rising edge 5 with which the nominal phase of the transition pulse rising edge 6 is locked by means of the phase comparator. This phenomenon is described in detail in U.S. Pat. No. 4,809,088, issued on Feb. 28, 1989, and assigned to the same assignee as the present invention. It will be apparent, from inspection of FIG. 2, that, were the VCO clock signal rising edges 5 used to define the code bit cell boundaries 7, there would be approximately a 50% probability that a transition pulse, having rising edge 6, would be jittered early and therefore not captured in the proper code bit cell, giving rise to a read data error. A code bit cell should properly have its boundaries equidistant from, or symmetric about, the mean of a symmetric distribution of transition pulse positions 8, rather than the other way around. Since the triggering edges of the VCO clock signal provide the necessary phase reference to the nominal phase position of a transition pulse in the phase detector, some other means must be provided to capture a transition pulse within a bit cell boundary without regard to its displacement due to jitter.

A data synchronizer must establish what is termed a data detection window or, simply, a "window" around the expected position of a transition pulse. Windows are generated end-to-end in time by the data synchronizer at a repetition rate equal to the VCO clock frequency and, therefore, the channel rate of the data. An ideal window may be looked at as an allotment of time within which a transition edge, if it occurs, will be interpreted as occurring exactly in the window center, thus allowing for random displacement of individual transition pulses due to bit jitter, with no effect on the accuracy of the data recovery error rate. Because of the bell shaped position probability distribution associated with displacements due to bit jitter, it can be seen that for optimum performance, the window must be accurately centered about the mean of this distribution.

The most common prior art data synchronizers employ a phase-locked loop comprising a phase comparator, charge pump, low pass filter and VCO as described previously. The phase comparator receives the data at one input and the VCO output clock on another input for phase comparison. Additionally, the VCO output clock is inverted by an inverter element, and the inverted clock is applied to a data detector as a data detection window. Inversion has the effect of delaying the VCO output clock by one half of its period and thus causing the triggering edges of the inverted clock signal to be substantially symmetric about the position distribution of transition pulses which are then centered within respective data detection windows.

A typical prior art data synchronizer is illustrated in FIG. 3. Connected to receive pulses from a disk drive 3 and pulse detector 3a, it comprises a delay line 10, a data detector 19, a window generator 21, and a phase-locked loop 4 formed of a phase comparator 11, charge pump 17, filter 18, and VCO 14.

As read data is recovered from the disk drive 3, transition pulses 9, representing pulse-formed raw data, are developed in the pulse detector 3a in the drive read channel. The raw data transition pulses are delayed in time by the delay line 10, and the resulting delayed data pulse 12 is directed to an input of the phase comparator 11. The output of the VCO 14 (hereinafter phase detection window clock 13) is applied to the phase comparator 11, where its phase is referenced (compared) to the phase of the input signal (delayed data pulse 12). The phase comparator 11 produced two outputs, pump-up pulse 11a and pump-down pulse 11b. Pump-up pulse 11a is produced if the delayed data pulse 12 leads the phase detection window clock 13, and pump-down pulse 11b is produced if the delayed data pulse 12 lags the phase detection window clock 13. The width of the pulses 11a, 11b reflects the extent of the lead or lag respectively. The outputs 11a, 11b are applied to the charge pump 17, which is operative to apply a source or sink current to the filter 18, depending on whether it receives pulse 11a or 11b. The combination of phase comparator and charge pump is sometimes referred to as a "phase detector" 22 and shall, when appropriate be so referred to herein. In response to the phase detector signal, the filter 18 applies a jitter-free, low-frequency control signal 18a to the VCO 14. The unfiltered control signal's sign depends on whether the delayed data pulse 12 leads or lags, and its magnitude is a function of the extent of the lead or lag. Thus, the output frequency of the VCO 14 is increased or reduced, as appropriate, to reduce the lead or lag at the inputs of the phase comparator 11. The phase-locked loop 4 thus insures that the VCO output, used as the phase detection window clock 13, is locked in phase with the incoming data.

The phase detection window clock 13 is a regular and periodic signal, whereas the occurrence of a data bit is irregular. Attempting to compare the phase of a phase detection window clock 13 to a data ZERO, i.e., when there is no transition pulse edge, would lead to runaway correction, unless the phase comparator 11 was disabled during those times a transition pulse 9 was not present. For this reason, the raw data 9 is directed as a phase error detector enable signal to the enable input 16 of the phase comparator 11. This insures that the phase comparator 11 is enabled just prior to the arrival of a delayed data pulse 12 whose phase is to be compared to that of the phase detection window clock 13.

Data detection occurs in a data detector 19, which functions to determine whether a delayed data pulse 12 occurs within a respective data detection window. The delayed data pulse 12, which is being phase compared to the phase detection window clock 13, is also directed to the input of the data detector 19. The data detector 19 may include a D flip-flop with its D input tied to ground. A data detection window clock 20 is derived from the VCO's phase detection window clock 13 by inverting that signal through an inverting means 21 provided in the window generator 21. Inversion of the phase detection window clock 13 seeks to construct a data detection window clock 20 having the same period as the phase detection window clock 13, and having a 180° phase relationship therewith, such that successive triggering edges of the data detection window clock 20 bracket successive triggering edges of the phase detection window clock 13. Since triggering edges of the phase detection window clock 13 are phase-locked with the delayed data pulses 12, the triggering edges of the data detection window clock 20 will therefore bracket the delayed data pulses 12 as well. The object of this data detection window clock 20 is to provide a synchronous stream of time windows, within which the distribution of positions of delayed data pulses 12 (when they occur) is centered, such that bit jitter merely displaces a pulse within the window. If a delayed data pulse 12 occurs within a particular data detection window, the data detection window clock 20 provides the additional function of clocking the D flip-flop within the data detector 19 such that a data pulse, so detected, is synchronously latched into the D flip-flop by action of the data detection window clock 20 and is available on the output of the data detector 19 as a stable, synchronized data signal, having a fixed relationship with the data detection window clock 20, and having the position variations due to bit jitter removed.

The main shortcoming of prior art data synchronizers relying on inverter elements to derive a data detection window clock 20 from the phase detection window clock 13 is that the inherent internal delay of an inverter element precludes the data detection window clock 20 from being exactly 180° out-of-phase with the phase detection window clock 13, and therefore from exactly symmetrically bracketing the distribution of delayed data pulses 12. Power supply voltage fluctuations, temperature variations and manufacturing parameter drift combine to distort the symmetry of an inverter's output characteristic, making it a less-than-ideal phase shifter. This lack of symmetry has significant implications for high-speed, low-error-rate data recovery systems.

Error rate is defined as the number of data bits read before a detection error is encountered. For example, a $10^{-10}$ error rate means that one detection error will occur, on average, for every 10 data bits recovered from the disk drive. In practice, lack of perfect symmetry between the data detection window clock 20 and the phase detection window clock 13 selectively shifts the boundaries of the detection window relative to the center of the data pulse position distribution. Any offset from center, in the detection window boundaries, will allow a portion of a tail of the data pulse position distribution to fall outside the detection window, in the direction away from the window offset, increasing the error rate, i.e., a detection window which is offset late by inherent delay, will not detect a data pulse positioned very early in the distribution. Error rate increases to the extent data pulses drift beyond the window boundaries.

Given an acceptable error rate for a particular window width, such as $10^{-10}$, for a 40-nanosecond window width, a suitable means for determining whether that rate has been exceeded becomes desirable. A known technique for ascertaining error rate is to shift the window relative to the delayed data pulses 12, which has the effect of narrowing the window, causing a data pulse to fall outside it after a fewer number of total delayed pulses than without window shift. Since the error rate curve, when plotted on a logarithmic scale, is nearly linear along a substantial portion of its opposite legs (see FIG. 5 of the above-referenced patent), measurements with a few progressively-greater window shifts can be used to extrapolate error rates for relatively tighter windows. Thus, for example, a measurement might be taken with a window shift which will cause one pulse to fall outside the window after the occurrence of $10^7$ pulses, and another reading with a window shift which will cause one pulse to fall outside after the occurrence of $10^5$ pulses. The detected error rate resulting from such window shifts could then be extrapolated to predict the window width that would result in one pulse out of $10^{10}$ falling outside the window or, conversely, the number of pulses that would be required before one pulse falls outside the window whose width is 40 nanoseconds.

Expensive test equipment is available to bring about window shifting externally of the disk drive. A preferred alternative is to provide equipment which is built into the disk drive equipment and which enables window shifting without use of external equipment. One such alternative system is disclosed in the above-referenced patent. In pertinent part, it includes a data synchronizer having a disk drive, phase-locked loop, and data detector similar to those illustrated in FIG. 3. In the system disclosed in the referenced patent, a variable delay is interposed in the path between the disk drive and the data detector whereby the delayed pulse from the disk drive is further delayed by a variable amount relative to the window clock.

Among the objects of the invention disclosed in an application filed Apr. 12, 1991 by Wilson et al., U.S. patent application Ser. No. 07/685473, the present assignee and incorporated herein by this reference, is to provide a disk drive data synchronizer in which the distribution of possible bit-jittered positions of a data pulse is precisely centered within a data detection window.

These and other objects are attained in accordance with the referenced invention by a disk drive data synchronizer which derives from an irregular series of data pulses in a pulse train (such as delayed data pulses 12) window clock signals designating successive time periods (T), each window clock signal being dedicated to the discerning of the presence or absence of a respective one of the data pulses during a respective one of the time periods and to the synchronization of a discerned one of those data pulses. The synchronizer comprises four principal elements: variable frequency means, a symmetric window generator, phase detector means, and data detector means. The variable frequency means generates a first periodic (VCO) clock signal whose nominal frequency is an integral multiple of the frequency of the pulse train and whose frequency is variable in response to a frequency control signal. The symmetric window generator is driven by the first clock signal and generates second and third periodic clock signals (phase detection window clock and data detection window clock) in response to, and at an integral submultiple of the frequency of, the first clock signal. The second and third clock signals are phased exactly 180° apart. The phase detector means produces a phase detector signal representative of the sign and magnitude of the phase difference between the second clock signal and the data pulses. Provided with the phase detector means are means for applying the average of the phase detector signal to the variable frequency means as its frequency control signal. Finally, the data detector means is responsive to the third clock signal and to the data pulses for discerning the presence or absence of a data pulse during each of the time periods (T) and synchronizing the discerned data pulse with respect to the third clock signal.

In further keeping with the referenced invention, the window generator comprises an integrated circuit having a line of symmetry separating substantially identical halves of the integrated circuit, each half having an output on which is carried a respective one of the second and third clock signals. More specifically, each half of the window generator comprises a respective one of a pair of cross-connected logic gates and a feedback loop connected between the output of the cross-connected logic gates and its input. In accordance with this aspect of the referenced invention, the integrated circuit is a frequency divider having first and second mutually exclusive states, and each feedback loop includes means for conditionally enabling it during portions of the times during which respective ones of those states prevail.

SUMMARY OF THE INVENTION

The present invention provides an improved system for producing a variable phase shift between delayed data pulses from a disk drive and the window clock which is derived from them. The system of the present invention comprises a data synchronizer wherein a phase-locked loop containing a phase-shift means is used to derive a window clock pulse from delayed data pulses produced by a disk drive. The phase-shift means is operative to introduce a variable delay in the window clock pulse relative to the delayed data pulses from the disk drive and is controlled by a phase-shift control means which is operative to produce a control voltage for governing the amount of phase shift produced by the phase-shift means. In keeping with a feature of the invention, the phase-shift means comprises a multi-stage delay line whose individual stages each have delays that are variable in unison by means of a common control signal. Further, the phase-shift control means comprises a phase-locked loop that includes at least one digital frequency divider for varying the phase-error signal that prevails in that loop and which is used as a control signal by the phase-shift means. Further flexibility in varying the delay of the window clock pulse is provided by means for selecting from among a plurality of delay line stages, a desired one of whose outputs is to be used in effecting the required window clock pulse delay. According to additional features of the invention, the phase-locked loop of the phase-shift control means includes a variable frequency means (such as a VFO) having delay elements matching those of the delay elements of the phase-shift means so that they operate as master and slave in response to the phase-error signal generated in the phase-locked loop of the phase-shift control means.

BRIEF DESCRIPTION OF THE DRAWINGS

These features and advantages of the invention, as well as other features and advantages of the invention, will be more apparent from a reading of the claims and of the detailed description of the invention in conjunction with the drawings described below.

FIGS. 1a-1d are a series of waveforms illustrating the effects of bit jitter on an encoded data stream;

FIGS. 2a-2c illustrate the random nature of bit jitter;

FIGS. 9a-9b are block diagrams of a system incorporating the present invention;

DETAILED DESCRIPTION

Figure 3:
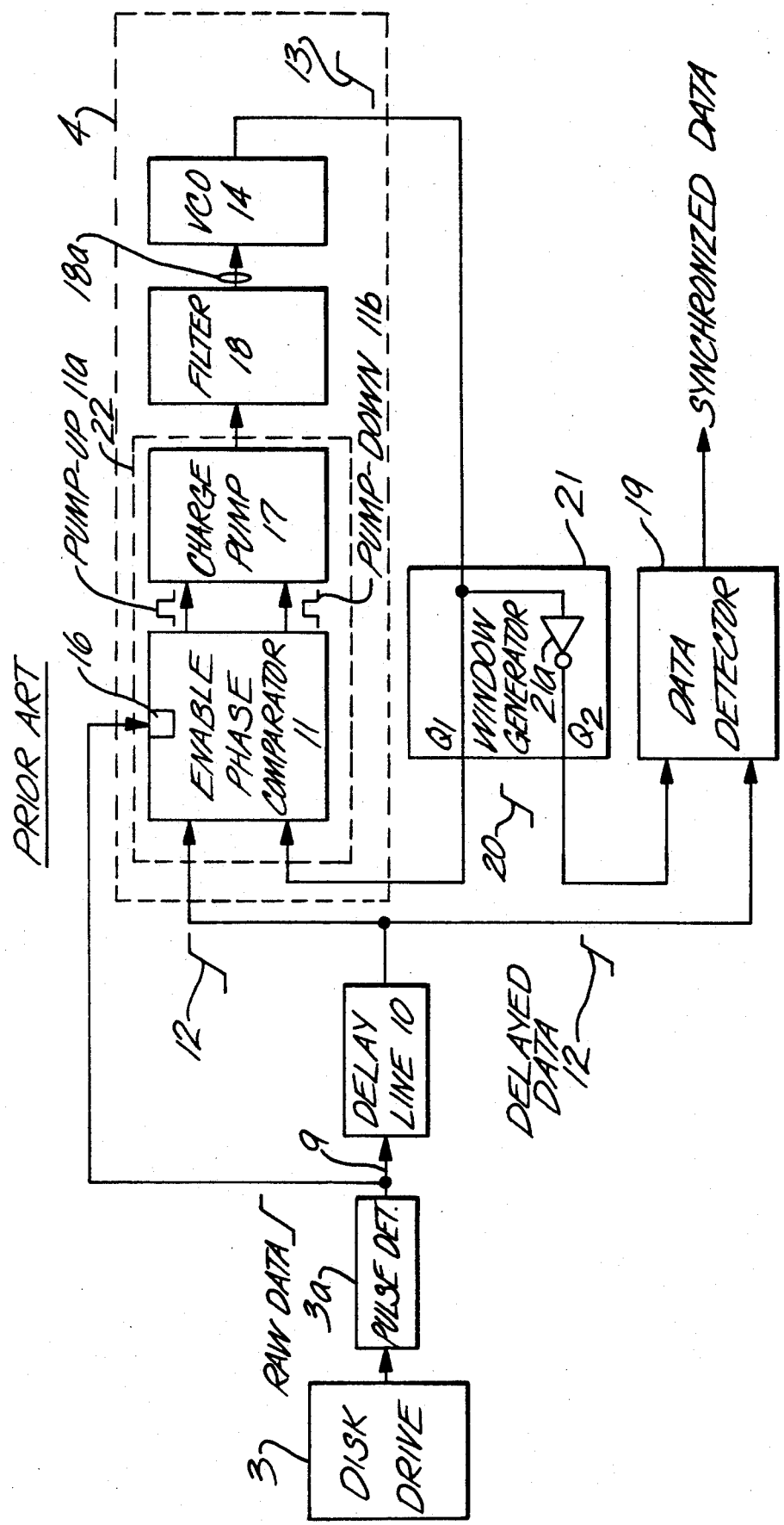
FIG. 3 is a block diagram of a conventional disk drive data synchronizer.
Figure 4:
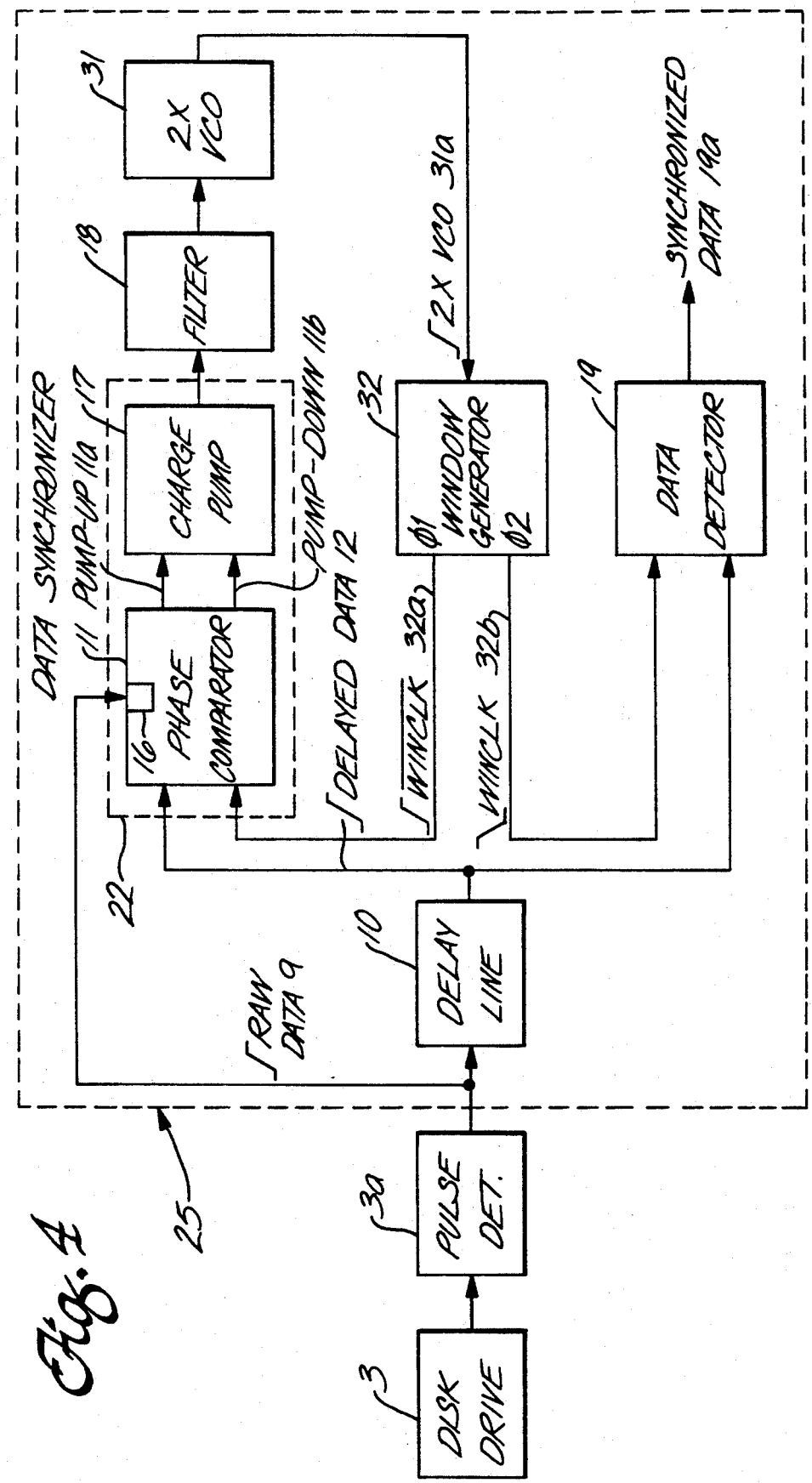
FIG. 4 is a block diagram of the improved disk drive data synchronizer described, in the above-referenced patent application to Wilson et al.

Referring to FIG. 4, there is disclosed a data synchronizer 25 constructed in accordance with the invention of the above-referenced Wilson et al. patent application. It is seen to be similar to the conventional data synchronizer described with reference to FIG. 3, but with two significant differences. First, the window generator 21 of FIG. 3 has been replaced with an improved window generator 32, and second, the VCO 14 of FIG. 3 has been replaced by a 2x VCO 31, in recognition of the fact that the window generator 32 is essentially a divide-by-two circuit. Since it is desired that the clock signals produced by the window generator have the same underlying frequency as that of the raw data pulses 9 (i.e., the channel rate as defined by the previously-discussed code rules), it is necessary to provide clock pulses to the window generator 32 at twice the channel rate. It will be understood that the channel rate will be at least equal to twice the highest frequency of the raw data as written. It will also be understood that the frequency of the 2x VCO 31 may be any integral multiple of the inputs to the phase comparator 11 so long as the input clock 31a to the window generator 32 is twice the channel rate.

In a manner similar to that described with reference to FIG. 3, raw data pulses 9, derived from a disk drive 3 by means of a pulse detector 3a, are applied to the enable input 16 of the phase comparator 11 and to the input of the delay line 10. The output of delay line 10, delayed data 12, is applied to one input of the phase comparator 11 and to one input of the data detector 19. The other input of the phase comparator 11 receives the output (hereinafter referred to as $\overline{\text{WINCLK}}$ 32a), appearing on the $\phi1$ output of the window generator 32. As will be explained in greater detail, the window generator 32 has two outputs, $\phi1$ and $\phi2$, on which appear two complementary signals (exactly 180° apart), respectively labeled $\overline{\text{WINCLK}}$ 32a and WINCLK 32b. The WINCLK 32b is applied to the other input of the data detector 19. Respectively, $\overline{\text{WINCLK}}$ 32a and WINCLK 32b are the phase detection window clock signal and the data detection window clock signal previously mentioned in connection with the data synchronizer of FIG. 3.

Figure 5:
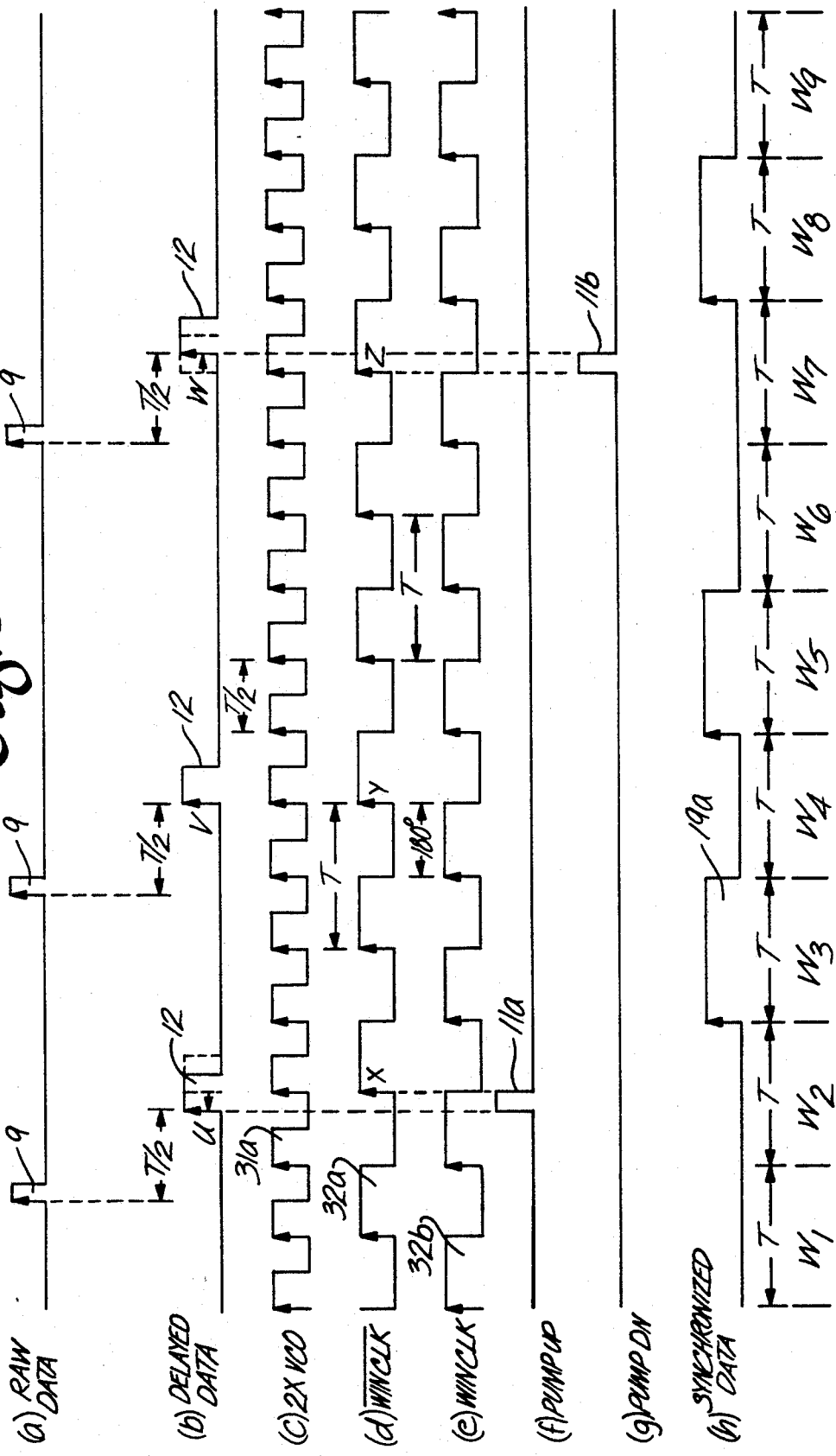
FIGS. 5a, 5b, 5c, 5d, 5f, 5g, and 5h are a series of waveforms illustrating the operation of the improved data synchronizer of FIG. 4.

The nature of the signals which appear in the circuit 25 of FIG. 4 may be best understood with reference to FIG. 5. Each of a succession of raw data pulses 9 causes a delayed data pulse 12 to appear at the output of the delay line 10, delayed with reference to the edge of the pulse 9 by a time T/2, which is seen from FIG. 5c to be the nominal period of the 2x VCO output 31a. The nominal frequency of the 2x VCO 31 is twice the channel rate of the raw data 9. The phase comparator 11 produces either a pump-up signal 11a or a pump-down signal 11b, depending upon the relative phases of the delayed data 12 and $\overline{WINCLK}$32a. If the rising edge of the delayed data leads the rising edge of $\overline{WINCLK}$ 32a, as shown by the rising edge U of the first delayed data pulse 12 in FIG. 5b and the nearest rising edge X of $\overline{WINCLK}$ 32a in FIG. 5d, a pump-up signal 11a is generated. The leading and trailing edges of the pump-up signal 11a are seen to coincide with the rising edges U and X of the delayed data pulse 12 and $\overline{WINCLK}$ 32a, respectively, so that the width of the pump-up signal 11a is proportional to the phase difference between them. A similar relationship may be observed by comparing the third illustrated delayed data pulse 12 in FIG. 5b and the nearest $\overline{WINCLK}$ 32a rising edge Z. In this case, the delayed data pulse 12 is retarded so that its leading edge W trails the leading edge Z of $\overline{WINCLK}$ 32a, resulting in a pump-down signal 11b whose width represents the extent of the phase difference between the rising edges W and Z. By means of the charge pump 17 and the filter 18, the frequency of the 2x VCO 31 is adjusted so that, when divided down by two in the window generator 32, the phase detection window clock, $\overline{WINCLK}$ 32a, will shift in phase until it is phase locked to the nominal position of the delayed data pulses 12. The latter condition is illustrated by the second delayed data pulse 12, shown in FIG. 5b, whose rising edge V is seen to coincide with the nearest-in-time rising edge Y of $\overline{WINCLK}$ 32a. When this condition prevails, no pump-up or pump-down signal is produced by the phase comparator 11. By virtue of the fact that the window generator 32 is operative to produce at its $\phi$2 output a signal WINCLK 32b, which is exactly 180° out-of-phase with the signal on its $\phi$1 output, the window generator 32 is operative to produce at its $\phi$2 output a signal whose successive rising edges define a series of data detection windows W1-WN, each having a time duration T, which windows are characterized by the fact that they bracket the position distribution of the delayed data pulses 12 so that they are centered within the respective data detection windows. This is best represented by the location of the second data pulse in FIG. 5b, whose rising edge V is seen to fall at the midpoint of its corresponding window W4.

The data detector 19 operates in the manner described previously with reference to the FIG. 3 data synchronizer. That is, it is operative to discern the presence during each of the windows W1-WN of a delayed data pulse 12 and to synchronize the discerned data pulse with respect to the data detection window clock, WINCLK 32b. Thus FIG. 5h shows that each time there occurs a delayed data pulse 12 (FIG. 5b), there is produced at the output of the data detector 19 a synchronized data pulse 19a, whose rising edge coincides with that particular rising edge of WINCLK 32b which defines the beginning of the window immediately following the window during which the delayed data pulse 12 occurred. Thus, each delayed data pulse 12 is discerned by the data detector during a given one of a succession of data detection windows W1-WN and is synchronized with respect to the data detection window clock WINCLK 32b so as to produce a synchronized data pulse 19a during the immediately-following one of the data detection windows W1-WN.

Figure 6:
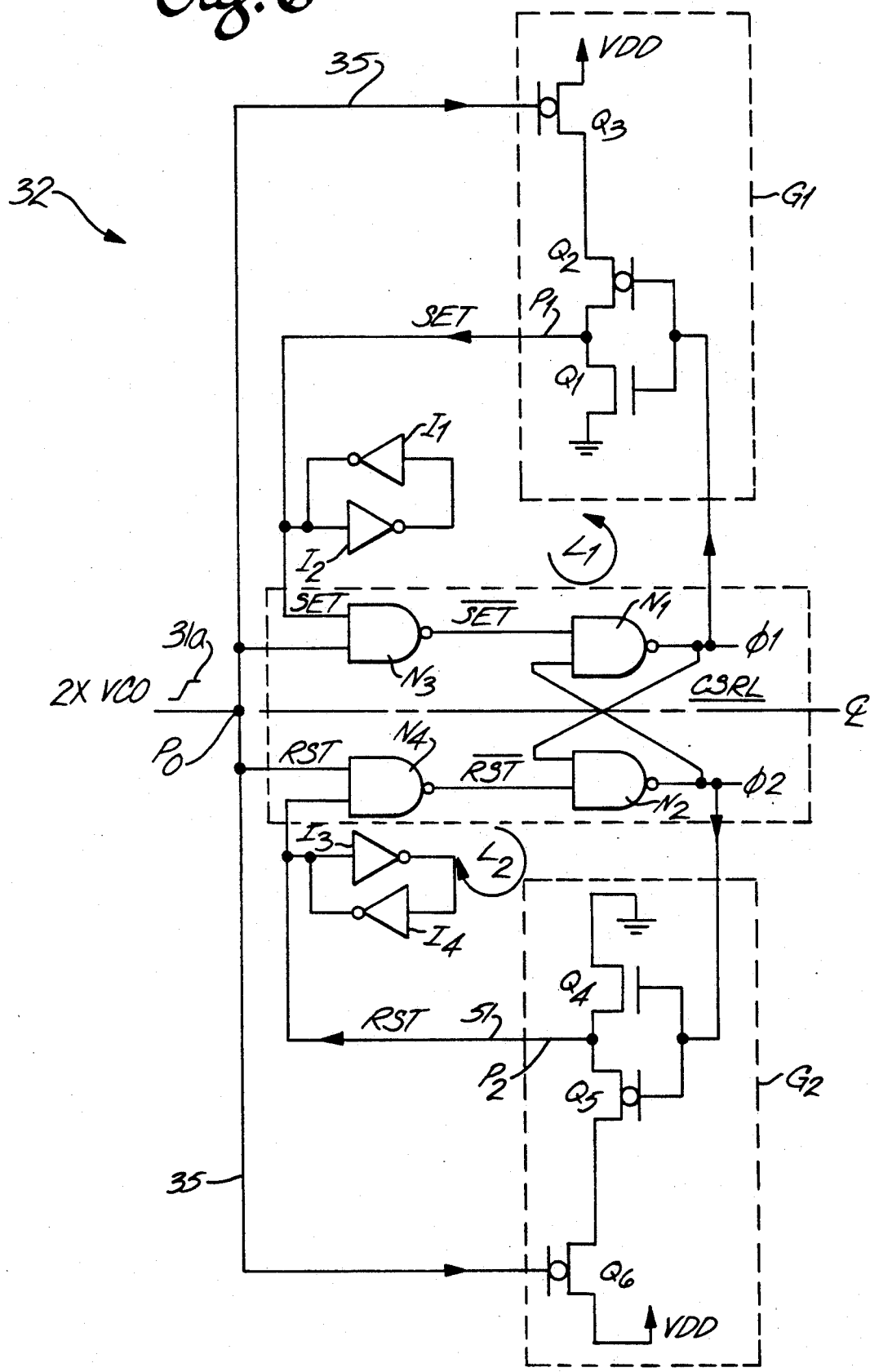
FIG. 6 is a circuit diagram of a divide-by-two circuit incorporating a feature of the present invention whereby clocked feedback loops are provided to prevent runaway oscillation.

FIG. 6 illustrates in greater detail a basic form of the window generator 32 depicted generally in FIG. 4. NAND gates N1-N4 are configured as a clocked set-reset latch (CSRL) where NAND gates N3 and N are two-input NANDs, each having one of its inputs connected to a common input clock signal, 2x VCO 31a, and whose outputs, denoted $\overline{SET}$ and $\overline{RST}$ respectively, are directed to the inputs of a cross-coupled pair of two-input NAND gates N1 and N2. The $\overline{RST}$ output of N4 provides one of N2's input signals, while the $\overline{SET}$ output of N3 provides one of N1's two inputs. The output of N2, the inverting or $\phi$2 output of the window generator 32, is also cross-coupled to the second input of N1, while the N1 output signal, the non-inverting or $\phi$1 output of the window generator 32, is cross-coupled to the second input of N2. A selectively switchable feedback network is connected to each of the respective outputs of NAND gates N1 and n2 and the respective second inputs of NAND gates N3 and N4, such that there is a selectively enabled feedback path L2 between the $\phi$2 output of NAND gate N2 and the RST input of NAND gate N4, and symmetrically, a selectively enabled feedback path L1 between the $\phi$1 output of NAND gate n1 and the SET input of NAND gate N3. The CSRL and its feedback loops L1 and L2 are disposed in such a manner that each feedback loop resides in its respective half of the circuit, and that the CSRL and its feedback loops, comprising the circuit, are symmetric about a common centerline of symmetry CL.

The first switchable feedback gate G1, in the feedback loop L1, comprises a pair of transistors, an n-channel Q1 and a p-channel Q2, connected in series, source-to-drain and with their gates connected jointly to the $\phi$1 output of the circuit. Following common convention, an n-channel transistor is "on" when the potential applied to its gate is "high", while a p-channel transistor is deemed "on" when its gate potential is "low". The transistors Q1 and Q2, which function as an inverter, are connected between ground and a source of positive potential, typically the supply voltage VDD, through a p-channel switching transistor Q3, whose gate is connected to a 2x VCO input node P0 through control line 35. The output of the switchable gate G1 is taken from node Pl, at the source-drain connection between transistors Q1 and Q2. Node Pl will be at ground potential when transistor Q1 is on, and either Q2 or Q3 is off, thus pulling the node low, and at the VDD potential when Q1 is off and transistors Q2 and Q3 are both on, thus pulling the node high. For reasons that will be explained subsequently, the switching transistor Q3 is provided to prevent node Pl from being pulled to VDD, by action of transistor Q2 alone, while the 2x VCO input signal 31a on the input node P0 is in a high state, whereas no similar transistor need be provided in series with Ql to prevent Pl from being pulled to ground while 2x VCO signal 31a is high.

The second feedback loop L2 is similarly configured, with the switchable feedback gate G2 comprising an n-channel transistor Q4, and p-channel transistors Q5, and Q6, wherein the transistors Q4 and Q5 are connected in series source-to-drain between VDD and ground through the switching transistor Q6, whose gate is connected to 2x VCO input node P0 through the control line 35. As in the case of the switchable gate G1, the output of switchable gate G2 is taken from node P2, at the source-drain connection of transistors Q4 and Q5. P2 likewise swings between ground and VDD, depending respectively upon whether transistor Q4 is turned on, and Q5 off, by action of $\phi 2$ going high, or Q4 is off and transistors Q5 and Q6 are on. Again, the switching transistor Q6 in gate G2 serves to prevent P2 from being pulled to VDD when 2x VCO signal 31a is high, but there is no corresponding transistor provided to prevent P2 from being pulled to ground during similar circumstances. The switchable gates G1 and G2 allow feedback of the $\phi 1$ and $\phi 2$ outputs to the SET and RST inputs of NAND gates N3 and N4, respectively, in such a manner that a change of state of the window generator is achieved once, and only once, for each like (in this case rising) edge of the 2x VCO input signal 31a.

Figure 7:
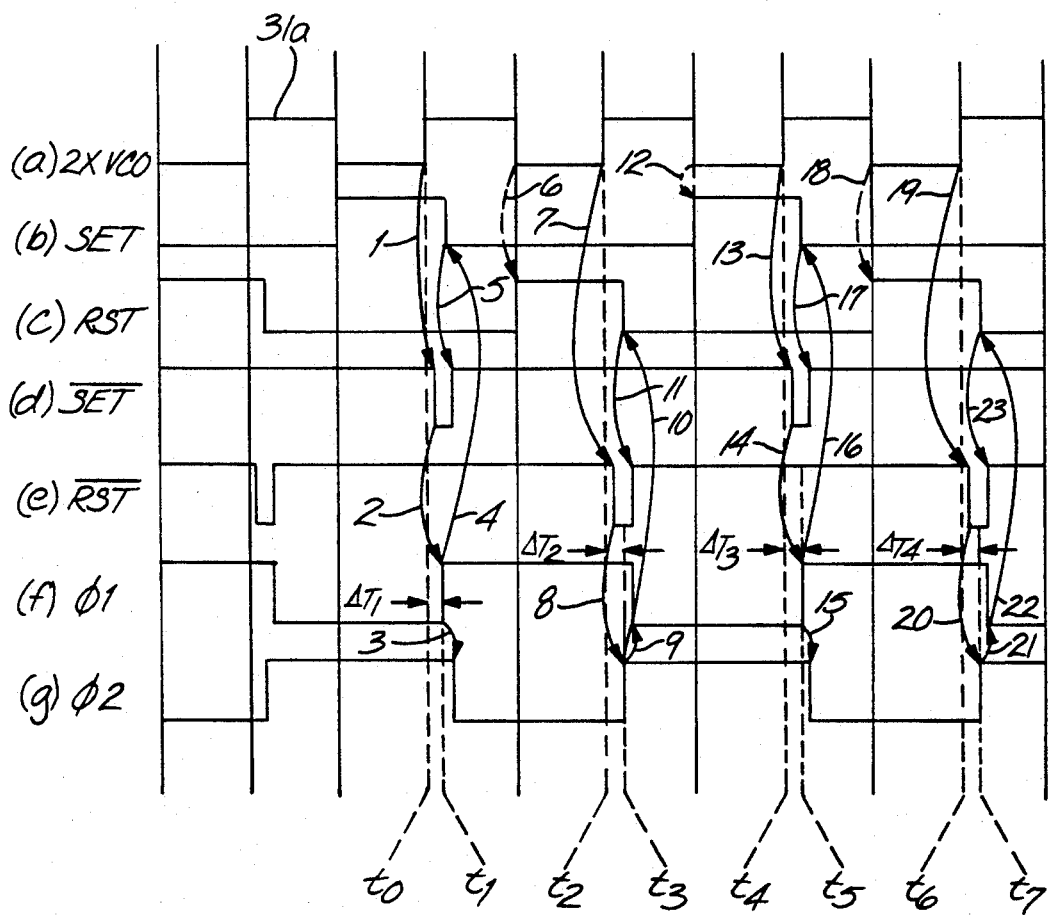
FIGS. 7a, 7b, 7c, 7d, 7e, 7f and 7g are a series of waveforms of signals which appear at various points in the circuit of FIG. 6.

The operation of the window generator 32 of FIG. 6 is reflected by FIG. 7, which shows one-and-a-half complete cycles of its operation. The entire operating sequence is described in the above-referenced Wilson et al. patent application, and that description need not be repeated here.

It may be observed, from inspection of FIG. 7, that the CSRL of FIG. 6 is switched between its SET and RESET states upon the occurrence of successive like triggering edges (in this case rising edges) of the input 2x VCO clock signal. A first series of alternate like 2x VCO edges, such as those shown as occurring at times $t_0$ and $t_4$, put the window generator into its SET state, and a second series of alternate like edges, such as those shown as occurring at times $t_2$ and $t_6$, i.e., alternating with the first series, put the window generator into its RESET state. The period of both $\phi 1$ and $\phi 2$ is therefore exactly twice that of the input signal (2x VCO signal 31a) and divide-by-two function is thereby accomplished. Since the period of 2x VCO signal 31a has been determined as being T/2, or one-half of the channel period T, it necessarily follows that the period of both $\phi 1$ and $\phi 2$ is equal to the channel period T.

Since 2x VCO 31a is a periodic waveform, such that the period (T/2) between each of its successive rising edges, such as those occurring at $t_0$, $t_2$, $t_4$, and $t_6$, is identical, it also follows that if the time delays associated with events triggered by the action of the first series of 2x VCO rising edges, such as $\Delta t_1$ and $\Delta t_3$, are equal to the time delays associated with events triggered by the second series of 2x VCO rising edges, such as $\Delta t_2$ and $\Delta t_4$, then successive like edges of the signal on $\phi 2$, such as those shown at times $t_3$ and $t_7$, will precisely bracket a corresponding successive like edge of the signal on $\phi 1$, such as that shown at time $t_5$.

The accuracy with which the rising edges of $\phi 1$ fall exactly midway between the rising edges of $\phi 2$ depends on the delays $\Delta t_1$ and $\Delta t_3$, associated with the $\phi 1$ (upper) half of the circuit, being identical to the corresponding delays $\Delta t_2$ and $\Delta t_4$, associated with the $\phi 2$ (lower) half of the circuit. To the extent the signal paths in the window generator's two halves can be made identical, the delays incurred in traversing those signal paths will be correspondingly identical. Since the two halves of the window generator are identical in terms of component logic, they may be manufactured as mirror images of one another, each half being exactly symmetric about a central axis of symmetry with the other, by means of photolithographic layout techniques well known in the art. Each half thus mirrors the physical configuration of the other, and by operation of well known semiconductor principles, each half will therefore mirror the electrical characteristics of the other, including the signal path delay.

Two synchronous clock signals are therefore generated, with successive like edges of one precisely bracketing successive like edges of the other, or, stated more particularly, with the rising edges of $\phi 1$ being precisely 180° out-of-phase with the rising edges of $\phi 2$.

Figure 8:
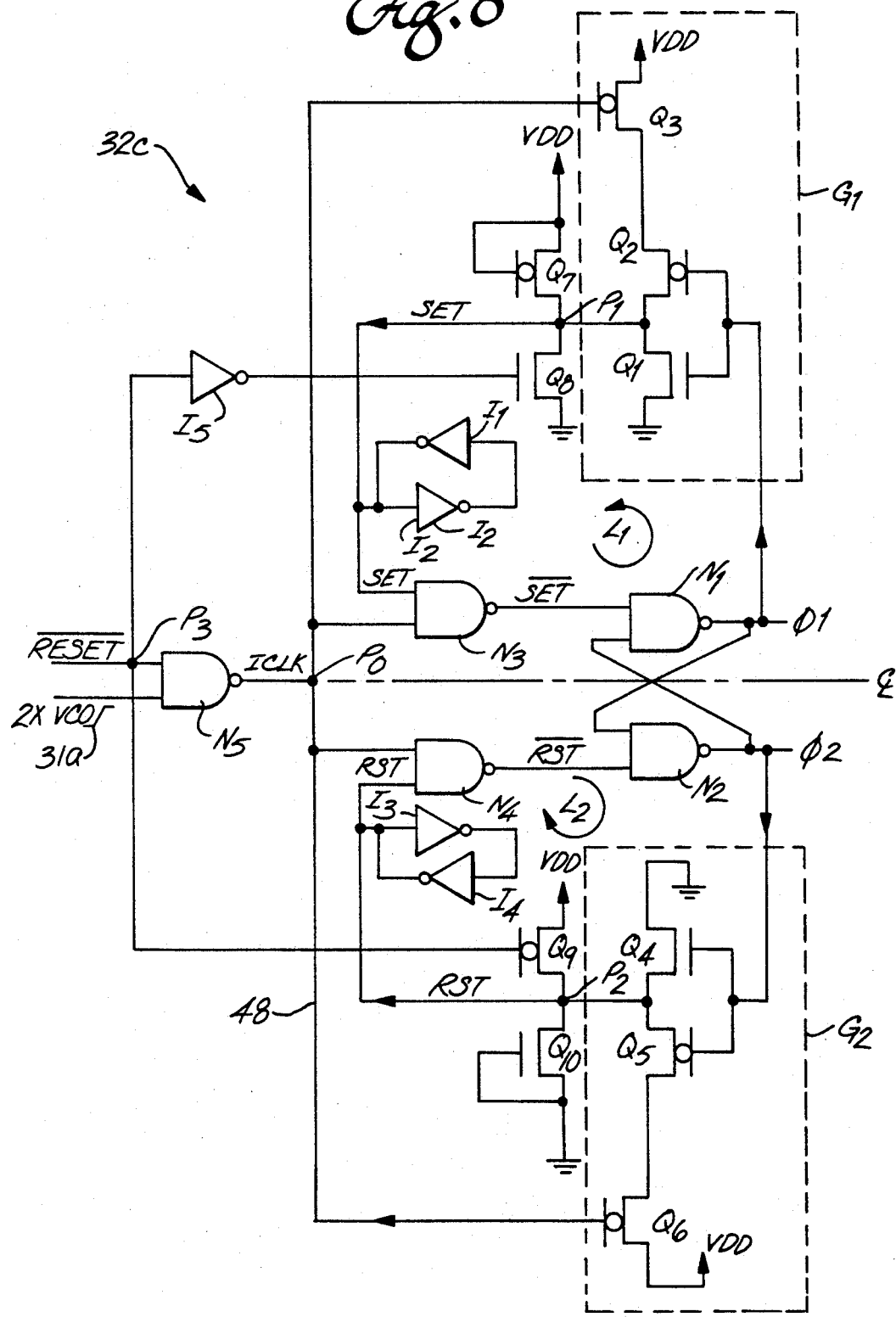
FIG. 8 is a circuit diagram of a divide-by-two circuit similar to that illustrated in FIG. 6, but with certain enhancements added to permit initially setting the circuit of FIG. 6 into a known state.

An enhanced version 32C of the window generator 32 is shown in FIG. 8, wherein means are provided for initially setting the window generator 32 of FIG. 6 into the reset state, regardless of the normally alternating logic level of the 2x VCO input signal. The enhanced window generator 32C comprises the window generator 32 of FIG. 6, enhanced by the addition of n-channel transistors Q8 and Q10, p-channel transistors Q7 and Q9, an inverter 15, and a NAND gate N5. The window generator 32 (or 32C) will be put into a RESET state when the $\overline{\text{RST}}$ and $\overline{\text{SET}}$ signals are 0 and 1 respectively. For $\overline{\text{RST}}$ to be a 0, both inputs to NAND gate N4 must be 1's. The enhanced window generator 32C is controlled by a $\overline{\text{RESET}}$ input signal in addition to the 2x VCO signal 31a. The 2x VCO signal 31a is applied to one input of the NAND gate N5 and, through it, is gated to the node P0 to which it has been directly applied in the FIG. 6 circuit. The $\overline{\text{RESET}}$ signal is applied to the other input of N5, consisting of the input node P3 of the enhanced window generator 32C. NAND gate N5 provides an internal clock signal, ICLK, which is identical to 2x VCO signal 31a if its $\overline{\text{RESET}}$ input is held high, and is a constant 1 if its $\overline{\text{RESET}}$ input is held low, without regard to the 2x VCO 31a signal level. Thus, one of the necessary conditions for enhanced window generator 32C to be put in a RESET state -- that both inputs to NAND gate N4 be 1's—is met. Pull-up transistor Q9 is provided, between node P2 and VDD, to pull node P2 to the VDD potential when it is turned on by $\overline{\text{RESET}}$ applying a 0 to its gate.

In order for the enhanced window generator 32C to be in a RESET state, it is a second necessary condition that $\overline{\text{SET}}$ be a 1. This condition is met by having any input to NAND gate N3 be a 0. Since ICLK is being held high by application of a 0 $\overline{\text{RESET}}$ signal to node P3, the pull-down transistor Q8 is provided, between node P1 and ground, to pull node P1 to the ground potential when it is turned on. Since a 1 is required to turn transistor Q8 on, an inverter, 15, is provided between node P3 and the gate of Q8, to invert the $\overline{\text{RESET}}$ 0 on signal level on node P3 to a required 1, turning Q8 on and thus providing a 0 signal at the SET input of NAND gate N3.

Without more, transistors Q8 and Q9 would violate the symmetry of the enhanced window generator 32C, since they are of opposite conductivity types, and therefore present different parasitic characteristics to their respective circuit halves. Dummy transistors Q7 and Q10 are provided to retain circuit symmetry. Dummy transistor Q7, configured as a reverse diode, is source-drain connected between node P1 and VDD, while dummy transistor Q10, likewise reverse diode configured, is source-drain connected respectively between node P2 and ground. Q7 and Q10 are identical in design to Q9 and Q8. Circuit symmetry is thus retained about the centerline CL. Since the inverter 15 is not in any portion of a signal path associated with the normal operation of the window generator, its impact on symmetry is immaterial.

Figure 9A:
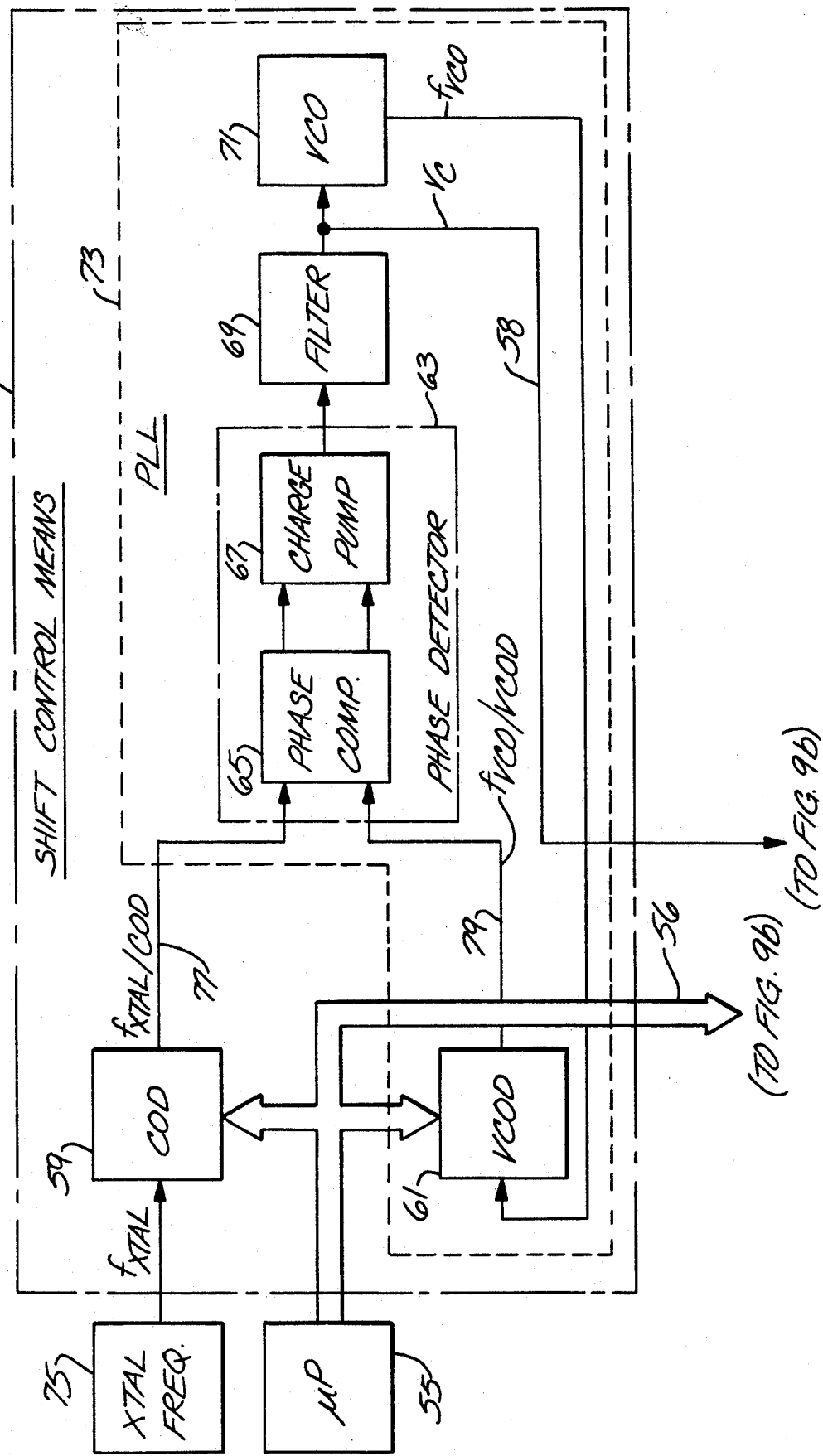
Figure 9B:
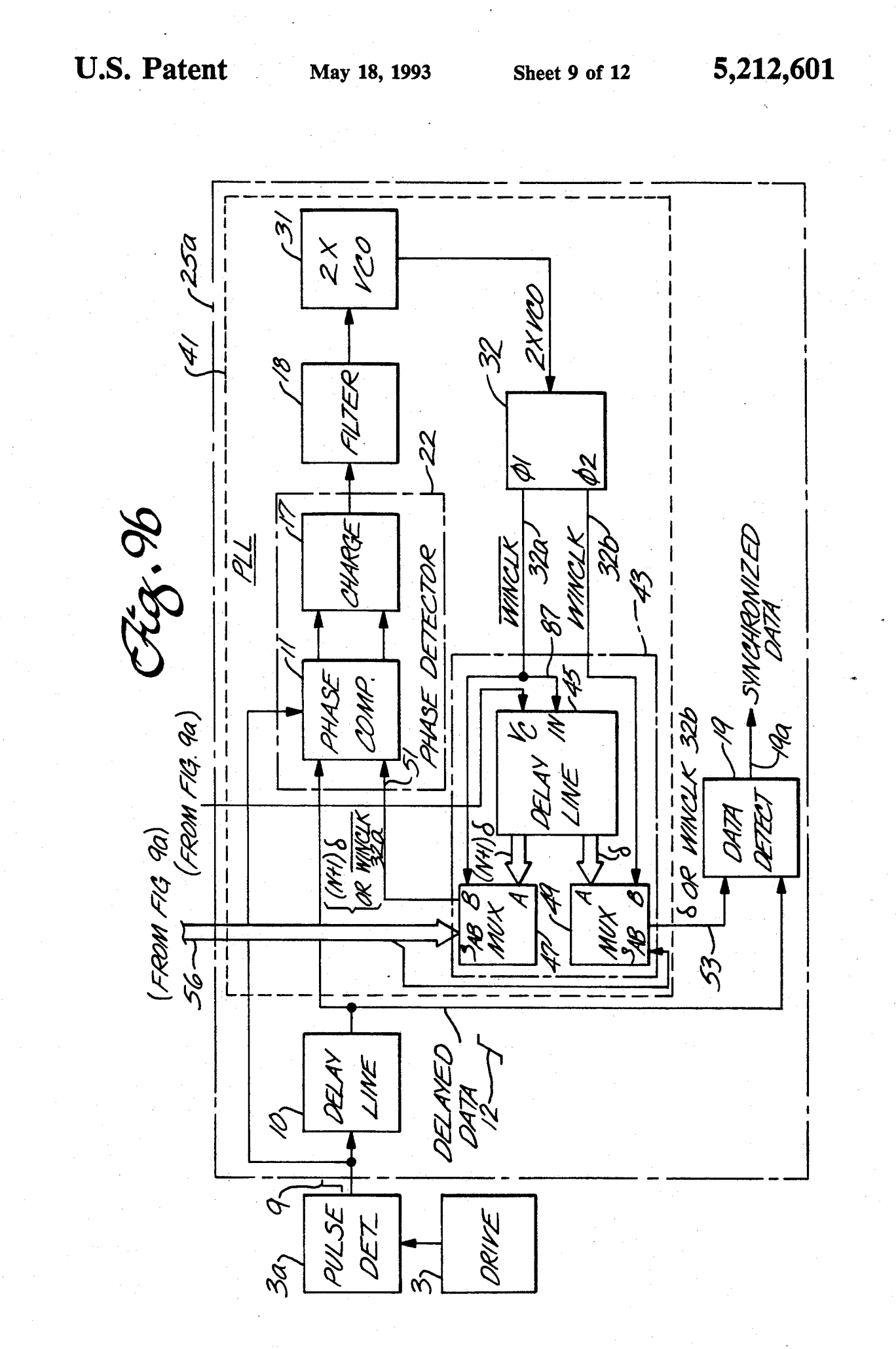

Having described the improved disk drive data synchronizer of the above-referenced Wilson et al. patent application with reference to FIGS. 4-8 as a background, there will be described next, with reference to FIGS. 9a-9b a data synchronizer 25a which is further improved in accordance with the present invention. Several elements of the data synchronizer 25a have a corresponding counterpart in the synchronizer 25 of FIG. 4. These elements appear within a block 25a in FIGS. 9a-9b and bear the same reference numerals in FIG. 9a-9b as they have in FIG. 4. They include the disk drive 3, pulse detector 3a, delay line 10, phase detector 22 comprising phase comparator 11 and charge pump 17, filter 18, 2X VCO 31, data detector 19, and window generator 32. In addition to the foregoing, there is provided a phase-shift means 43 connected between the outputs of the window generator 32 and the inputs of the phase comparator 11 and of the data detector 19. The phase detector 22, filter 18, 2X VCO 31, window generator 32, and the phase-shift means 43 form a first phase-locked loop (PLL) 41. The phase-shift means 43 comprises a multi-stage delay line 45 and a pair of multiplexers 47 and 49. Multiplexer 47 has an output connected over line 51 to one input of phase comparator 11 and is operative by included switching means to choose which of two inputs to ut on that line. One of the two inputs is $\overline{WINCLK}$ 32a from the window generator 32, the other input is from the delay line 45, an input which, as will be explained, comprises a series of lines connecting output taps of the delay line 45 to the multiplexer 47.

In a similar manner, the multiplexer 49 has an output connected over line 53 to one input of the data detector 19 and is adapted by included switching means to select from between two inputs to put on that line. One of those inputs is the WINCLK signal 32b from the window generator 32. The other input is derived from a tap of the delay line 45. By appropriate control means, a selection may be made by the included switching means of the multiplexers 47 and 49 to alternatively apply tot he phase comparator 11 and the data detector 19 either the outputs of the window generator 32, for an exact 180° phase difference between the signals so applied (representing a normal operating mode), or the outputs derived from the delay line 45 for a pair of signals whose relative phase is variable (representing the window-shifting mode).

In the normal operating mode of the data synchronizer 30, the elements within block 25a operate essentially in the manner of their counterparts in FIG. 4. That is, WINCLK signal 32b is derived by means of the phase-locked loop 41 from the data pulses such that the random pulse distribution of the data pulses 9 is disposed with its mean centered in the windows defined by the WINCLK signal 32b, and pulses are discerned and synchronized by means of the data detector 19.

Conversely, when the data synchronizer 30 is in its window shifting mode, an alternative pair of signals, respectively labeled [N+1]δ and δ, appear on the outputs of the phase-shift means 43 on which there normally appear the signals $\overline{WINCLK}$ 32a and WINCLK 32b respectively. Thus, when the system is in its window shifting mode, the phase-shift means 43 is operative in response to the output of the 2X VCO 31 to produce a clock signal [N+1]δ, which is applied over line 51 to an input of the phase comparator 11, and a window clock signal δ, which is applied over line 53 to the data detector 46.

In accordance with the invention, the phase-shift means 43 is operative to introduce a variable amount of phase difference between the clock signals [N+1]δ and δ. In its preferred embodiment, the phase-shift means 43 comprises the multi-stage delay line 45 having output taps at successive ones of its cascaded stages. The output of the first stage is used as the δ output, and another tap of a selected subsequent stage is selected as the [N+1]δ output of the phase-shift means 43. Means are provided not only to vary the delay δ of individual stages of the delay line, but also to permit selection of a desired one of its output taps as its [N+1]δ output. As a result, the phase difference between the two variable-phase outputs of the phase-shift means 43 is nδ+δ−δ, or Nδ. In this manner, the phase difference between the variable-phase outputs of phase-shift means 43 may be selected to be any one of a number of multiples of δ, and δ itself may be varied over a predetermined range, by means to be described.

The phase-shift means 43 has two "degrees of freedom," or means of adjustment: delay per stage (δ) and number of stages (N). The number of delay line stages N to be used may be selected by a microprocessor 55 and conveyed to the multiplexer 47 over a bus 56. The delay per stage δ is set by applying a control voltage over a line 58 to the $V_c$ input of the phase-means 43. The $V_c$ control voltage is produced in a unique manner by a shift control means 57, which comprises a pair of programmable frequency dividers 59 and 61, a phase detector 63, comprising a phase comparator 65 and a charge pump 67, filter 69, and a VCO 71, all but frequency divider 59 being connected in a second phase-locked loop (PLL) 73. The phase comparator 65 may be essentially like the phase comparator 11, except that there is no need for an "enable" input and associated circuitry, since there are no missing pulses in the pulse trains that are being compared. Those skilled in the art will recognize the shift control means 57 as a frequency synthesizer. In keeping with the present invention, the shift control means 57 is used to synthesize a delay. Since that delay is, in turn, used to create window shift, the invention may, as a whole, be thought of as window shift synthesis.

The crystal oscillator divider (COD) 59 divides the frequency of a pulse train $f_{XTAL}$ from a source of stable frequency 75, such as a controlled-crystal oscillator, by a first number COD, and the VCO divider (VCOD) 61 divides the frequency of the output of the VCO 71 by a second number VCOD. The respective outputs $f_{XTAL}/$COD and $f_{VCO}/$VCOD are applied over lines 77 and 79 to first and second inputs of the phase detector 63. The phase detector 63 produces an error signal $V_C$ representative of the phase difference between the signals on lines 77 and 79 and, responsive to the signal $V_C$, the frequency of VCO 71 is altered until the signals on lines 77 and 79 are matched, both in frequency and in phase. The error signal $V_C$ is the ultimate output of the shift control means 57. The dividers COD 59 and VCOD 61 divide their respective input frequencies by factors which may be set by the microprocessor 55 to be any desired integer within a predetermined range. The desired integers are transmitted by the microprocessor 55 to the programmable dividers 59 and 61 over the bus 56. Since the phase detector 63 causes the PLL 73 to lock into a single frequency which will cause the phases and frequencies on its inputs to be equal, those inputs may be equated according to the following equation:

$$f_{XTAL}/COD = f_{VCO}/VCOD \quad (1)$$

Rearranging terms, :

$$f_{VCO} = f_{XTAL}(VCOD/COD) \quad (2)$$

It is apparent, then, that $f_{VCO}$ may be varied over a range which is a function of $f_{XTAL}$ and the fraction VCOD/COD, whose numerator and denominator may each be varied over a range of integers. The crystal frequency source 75 may produce either a single frequency $f_{XTAL}$ or a plurality of stable frequencies across a predetermined range from which $f_{XTAL}$ may be selected for added control over the value of $f_{VCO}$.

Each particular value of $f_{VCO}$ is accompanied by a corresponding value $V_C$, since it is the control signal $V_C$ which alters the output frequency $f_{VCO}$ of the VCO 71. Thus, it is seen that the control voltage $V_C$ may be varied over a predetermined range by forcing a change in the phase and frequency of the VCO 71, which may be achieved by generating an appropriate range of integers for COD 59 and VCOD 61 in the microprocessor 55 and feeding those integers to them over the bus 56. If desired, the value of $f_{XTAL}$ may be additionally manipulated. What will become apparent as this description proceeds is that, by virtue of the similarity in the elements which comprise the VCO 71 and the delay line 45, the control voltage $V_C$, produced by the shift control means 57, is uniquely effective in working with the phase-shift means 43.

Figure 10:
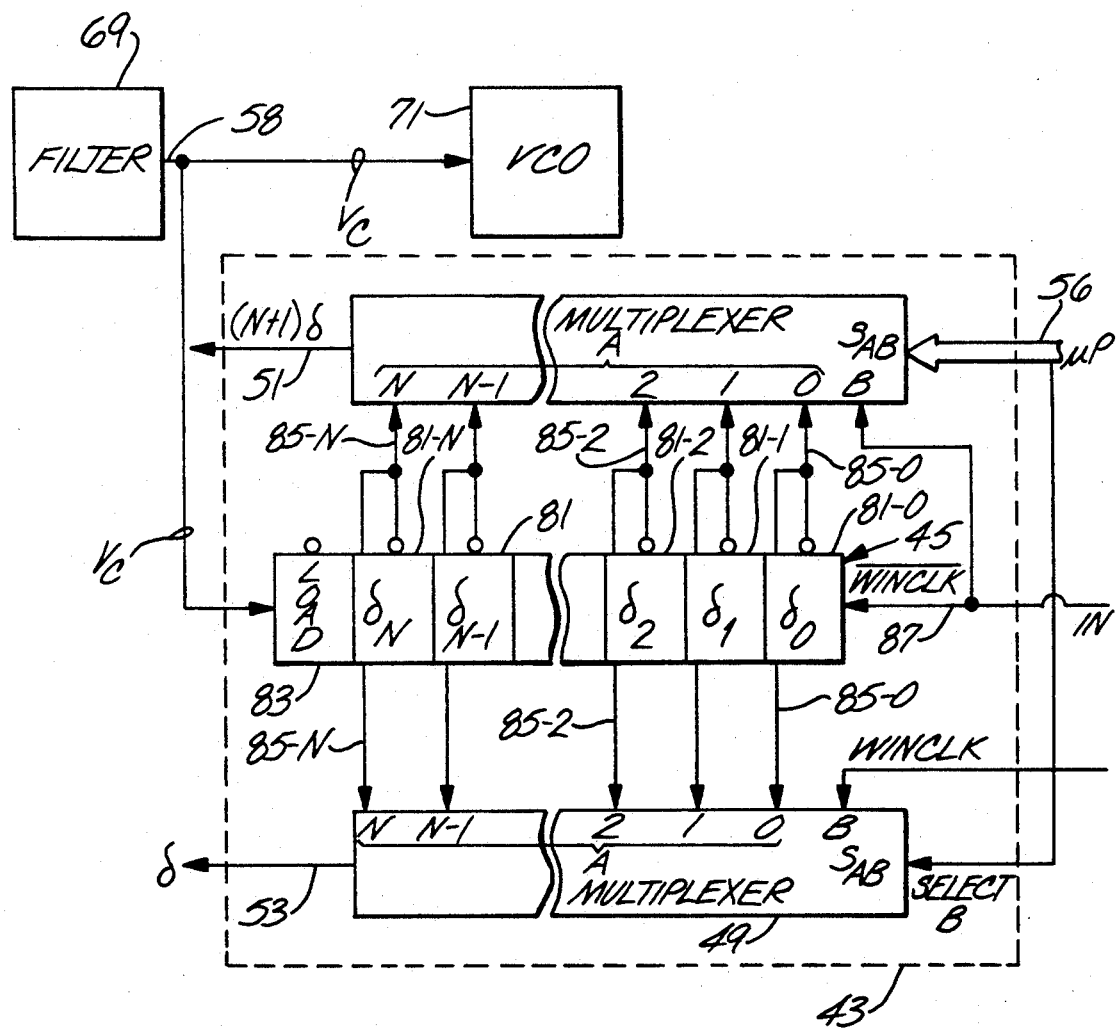
FIG. 10 is a block diagram showing in greater detail the phase-shift means shown in FIGS. 9a-9b.
Figure 11:
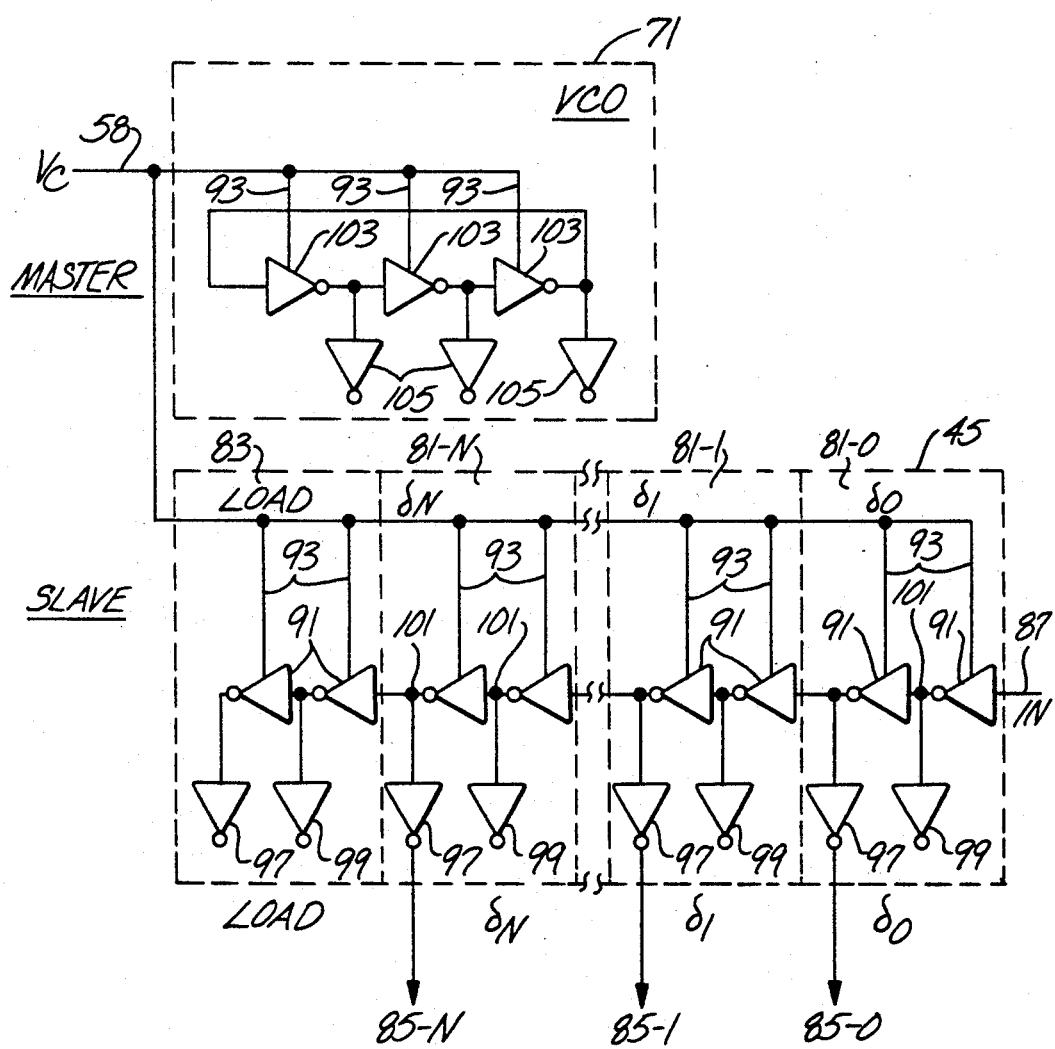
FIG. 11 is a circuit diagram showing the master-slave relationship between elements of the phase-shift means and the phase-shift control means of FIGS. 9a-9b.

Referring to FIGS. 10 and 11, the delay line 45 of the phase-shift means 43 has a plurality of delay stages 81-0 through 81-N (collectively referred to as "stages 81") and a "dummy" load stage 83. Each delay stage 81 has an output connected over a line 85 to a respective input of the first and second multiplexers 47 and 49. The delay line stages 81 are labeled progressively $\delta_0$ through $\delta_N$. The stages are cascaded so that the input line 87 to the first stage $\delta_0$ constitutes the input to the delay line 45, and the output of each stage is delayed relative to the input on the line 87 by the amount of delay produced in that stage and in all preceding stages. The primary output of the multiplexer 47 is carried by the line 51 constituting the [N+1]δ output of the phase-shift means 43. Any output from that of stage $\delta_0$ to and including that of $\delta_N$ may be selected. Since stages are labeled from $\delta_0$ on up through $\delta_N$, if N is 0, the delay will be δ (that produced by the first delay line stage $\delta_0$). Thus, it is seen that the delay between the input on line 87 and the output on the line 51 will always be [N+1]δ.

By virtue of PLL 41, the [N+1]δ output on line 51 is locked in phase with the data pulses 12. Therefore, in order to maintain at Nδ the phase difference between data pulse 12 and the clock pulses applied over line 53 to the data detector 19, the latter signal is taken by means of the second multiplexer 49 from the output 85-0 of the $\delta_0$ delay line stage 81. Thus, the phase difference across the outputs of phase-shift means 43 is always [N+1]δ − δ = Nδ + δ − δ = Nδ.

It is also desirable that the circuit impedance between the input 87 and the line 53 be exactly the same as that between the input line 87 and the output line 51. It is for that reason that the second multiplexer 49 is interposed between the delay line 45 and the output line 53. In operation, only one of the A inputs of the multiplexer 49 is selected—that which is supplied over output line 85-0 by the $\delta_0$ stage 81-0 of the delay line 45. Thus, multiplexer 49 serves as an equalizing load to match the load presented to the delay line 45 by the multiplexer 47.

Referring to both FIGS. 10 and 11, each of the respective stages 81 of the delay line 45 comprises a pair of voltage-controlled inverters 91 connected in series. Each inverter 91 is operative to produce a delay which is a function of a control voltage Vc applied to its control input 93 over the line 58 leading from the filter 69 of PLL 73. Two of the inverters 91 connected in series constituting a delay line stage 81 produce a phase-shift δ which may be varied over a predetermined range between a minimum (δmin) and a maximum (δmax), which is usually a function of the circuit limitations of the inverters 91. Presently available circuits tend to limit the ratio of δmax:δmin to about 3. Outputs of the individual stages 81 are applied through buffering inverters 97 to the output lines 85 which constitute the outputs of the delay line 45. Buffering inverters 99 are also shown connected to the nodes 101 between respective ones of the inverter pairs 91 of given stages 81 and serve simply to match the impedances presented by the buffering inverters 97 connected to the outputs of those stages.

Each delay line stage 81 puts a load on the output of the preceding stage. In order to have a similar load presented to its output, the last of the delay line stages 81-N, $\delta_N$, is followed by a load stage 83, which is identical to one of the delay line stages 81 but which has not output.

The multiplexer 47 has two groups of inputs, labelled generally "A" and "B". The same is true of the multiplexer 49. Both multiplexers have two modes of operation, A and B. In operating mode B, they connect respective ones of $\overline{WINCLK}$ and WINCLK to the phase comparator 11 and the data detector 19, respectively, over a corresponding one of the lines 51 and 53. In operating mode A, the multiplexer 47 applies a selected one of [N+1] outputs from the delay line 45 to the phase comparator 11 as the [N+1]δ signal over line 51. In this operating mode A, the multiplexer 49 applies over its output line 53 as the signal δ the selected one of the outputs of delay line 45 to the data detect circuit 19. The multiplexer 47 is controlled so as to apply the output of any selected one of the [N+1] stages of the delay line 45 on its output line 51. In contrast, the multiplexer 49 is controlled so that, when in mode A, it can receive only the output of $\delta_0$ stage of the delay line 45 and apply that output on the multiplexer's output line 53 as the signal δ.

Control of the multiplexers 47 and 49 is accomplished by the microprocessor 55 over the bus 56. [N+2] lines in the bus 56 lead from the microprocessor 55 to the $S_{AB}$ input on the multiplexer 47. One of those lines controls a switching device in each of the multiplexers 47 and 49 which determines whether or not the multiplexers 47 and 49 should apply the signals on their B inputs to their respective outputs. If it is desired that the signals on the B inputs be used by the multiplexers 47 and 49, a "Select B" signal is applied to their respective $S_{AB}$ inputs over the "Select B" line from the microprocessor 55. Conversely, if it is desired that the B input not be used, one of the other [N+1] lines of the bus 56 from the microprocessor 55 receives a signal therefrom and applies it to the appropriate one of a plurality of switching devices in the multiplexer 47 so that a selected one of the [N+1] stages of the delay line 45 has its output applied to the output line 51 of the multiplexer 47. Correspondingly, if it is desired to apply the output of the $\delta$ stage of the delay line 45 through the multiplexer 49, the absence of a select B signal is interpreted by the switching device of the multiplexer 49, which is controlled by that signal, as an instruction not to access the signal on its B input, but, instead, to access the signal on its 0 input, which is the only one of the A group of inputs which is ever used by the multiplexer 49.

To sum up, the presence of a select B signal causes both of the multiplexers 47 and 49 to apply the signals on their B inputs to their respective outputs 51 and 53. The absence of a select B signal will cause the output of the $\delta$ stage, which is hard-wired to the 0 input of the multiplexer 49 to be applied to the multiplexer's output 53. Moreover, the absence of a select B signal will be accompanied by a signal on one of the other [N+1] control lines in the bus 56, causing a selected one of the A inputs of the multiplexer 47 to apply the output of a selected one of the [N+1]delay line stages 81 to be applied to the phase comparator 11 through the output line 51.

The VCO 71 of the shift control means 57 is also shown in FIGS. 10 and 11. It is preferably comprised of three voltage-controlled inverters 103, identical to inverters 91 which make up the delay line 45. The output of the last inverter 103 is connected to the input of the first to form a ring oscillator whose frequency is variable by the control voltage Vc over the line 58. As is well known, the VCO 71 may comprise any odd number of inverters 103, three being the minimum desirable. A buffering inverter 105 is connected to the output of each voltage-controlled inverter 103, making the circuit identical (except for the feedback loop) to 1-½ stages of the delay line 45.

The VCO 71 and the delay line 45 function as master and slave. Since the elements 103 of the VCO 71 are matched to elements 91 of the delay line 45, each of the delay line stages 81 is in effect a facsimile of ⅔ (in the illustrated embodiment) of the inverter chain comprising the VCO 71. Therefore, whatever frequency is imposed on the VCO 71 by the integers set in COD 59 and VCOD 61 will result in a delay $\delta$ across two of the three inverters 103 of the VCO 71, and that delay $\delta$ will be precisely reproduced in each of the delay line stages 81, since both the VCO 71 and the delay line 45 receive the same control voltage Vc over the line 58. In other words, the delay line 45 is slaved to the VCO 71 and precisely mirrors the delays created therein. Thus, the delays $\delta$ in respective delay line stages 81 are a direct function of $f_{XTAL}$, COD, and VCOD. The range over which the delay $\delta$ may be varied is limited by the range over which the VCO 71 is capable of operating, and the earlier-mentioned limit of 3 for $\delta$max:$\delta$min may be taken as typical.

Figure 12:
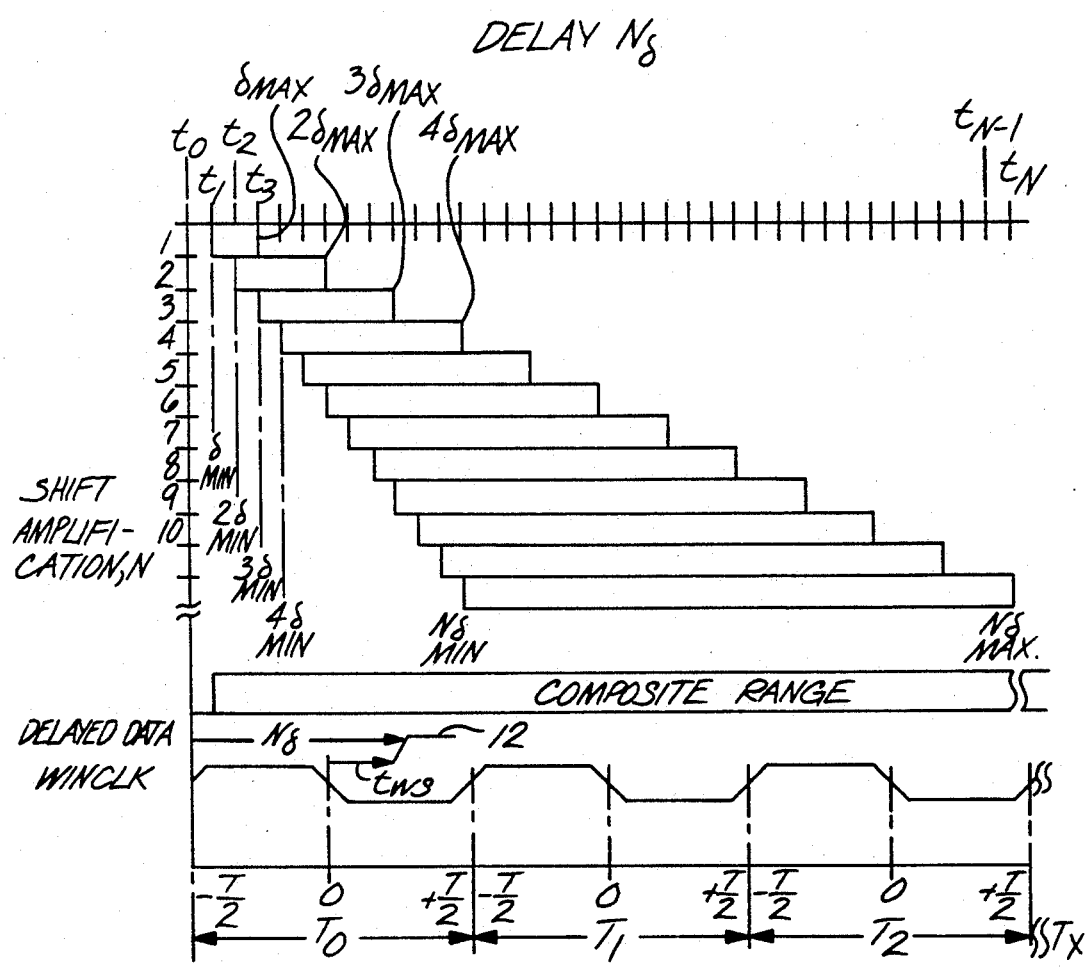
FIG. 12 is a combined bar chart and timing diagram illustrating the composite range of variable-phase shifts attainable by the phase-shift means of the present invention.

The total range of delays available from the phase-shift means 43 is illustrated in FIG. 12. The figures should be viewed first as a bar chart, with the shift amplification axis N being horizontal, and the delay N$\delta$ axis, vertical.

Shift amplification alludes to the fact that the shift produced by the first stage $\delta_0$ may be "amplified" by any factor up to N. Delay N$\delta$ is the total, or composite, range of delays available by combining the results of different amounts of shift amplification N. $\delta$min and $\delta$max are the minimum and maximum total delays obtainable with respective ones of different amplification factors N. Assume, for example, that no shift amplification is used, so that N is 1. This means that the output of the second delay stage $\delta_1$ is selected as the [N+1]$\delta$ output by the multiplexer 47 and that the output on line 51 is $\delta_1$, for a total delay of 2$\delta$ relative to the delay line input 87. The net phase difference between the outputs of the phase-shift means 43 is [N+1]$\delta$−$\delta$ or N$\delta$, which is $\delta$, since N=1. Hence, no shift amplification. Between them, the ranges of delays available at the outputs of successive stages $\delta_0$- $\delta_N$ $\delta_N$ provide a composite range which may be seamless, that is, without gaps between them, if certain rules are observed. The range of delays available at respective ones of the first four delay stages $\delta_0$-$\delta_3$ are $\delta$min-$\delta$max, 2$\delta$min-2$\delta$max, 3$\delta$min-3$\delta$max, and 4$\delta$min-4$\delta$max respectively. In the example illustrated in FIG. 12, these ranges, as well as the ranges associated with the stages above them, overlap. The amount of overlap increases with the number of stages involved. It can be shown that, in order to eliminate a gap in a composite range made up of the delays produced by a number of stages N, in which the lowest-order stage is $N_{min}$, it is necessary that the following relationship be observed: $\delta$max/$\delta$min equal or exceed $[N_{min}+1]/N_{min}$. Assume, for example, that a composite range is to be made up of the outputs of four delay stages and that the delay ranges ($\delta$min-$\delta$max) available at those four outputs are respectively 1-2, 2-4, 3-6, and 4-8. $N_{min}=1$, since that is the minimum number of stages that may be used to make up the composite range, $\delta$max/$\delta$min=2/1, since $\delta$max=2 and $\delta$min=1 for the first stage. This meets the requirement that $\delta$max/$\delta$min equal or exceed $[N_{min}+1]/N_{min}$, which in the present case, equals 2.

Next, assume that the respective delay ranges ($\delta$min-$\delta$max) are 1-1.5, 2-3, 3-4.5, and 4-6. There is a gap between the delay ranges of the first and second stages, the gap being between 1.5 and 2. This reflects the fact that the design did not meet the above-stated rule because $\delta$max/$\delta$min=1.5, whereas $[N_{min}+1]/N_{min}=2$.

The delay [N+1]$\delta$ may be obtained over the entire composite range either by setting a particular value for $\delta$, by means of the integers read into the dividers 59 and 61 of the shift control means 57, and then selecting a desired multiple of that delay, by means of the multiplexer 47, or, conversely, a particular output of the delay line 45 may be selected first, and then the value of $\delta$ swept across its available range by altering the values in the dividers 59 and 61. Advantageously, the entire composite range, or any part thereof, may be traversed over a wide range in precise increments by selecting the lowest-number delay line tap which will yield the desired delay, and traversing the range of delays available from that tap, by sweeping the frequency of the VCO 71 downward in small increments until some point in the overlap between that range and the range available from the next-higher tap. At that time, the next-higher tap may be selected and the frequency scaled back (increased, so as to reduce the delay in the inverters of the VCO 71 and of the delay line 45), until the total resulting delay matches that obtained from the previous tap. The downward frequency sweep may be continued until some time at which another switch is desired to the next-higher tap, and so on. The manner in which the range is traveled is optional and may be programmed from the microprocessor 55, as desired.

To understand the window shift obtainable by operation of the phase-shift means 43, it is helpful to turn FIG. 12 on its side, so that the axis along which WINCLK extends is horizontal. As so viewed, at the bottom of the figure will appear successive windows $T_X$, i.e., $T_0$, $T_1$, and $T_2$, each having a midpoint 0 and extremes ±T/2, that is, -T/2 and +T/2. A 0 window-shift condition ($t_{WS}=0$) will normally be represented by a 180° phase difference between the data and the window clock. Normally, Nδ, the phase difference between the inputs to the data detector 19, should be 180° for a 0 window shift $t_{WS}$. A greater delay $t_{WS}$, illustrated in FIG. 12 during time period $T_0$, reflects the fact that Nδ is greater than T/2. Generally, it may be seen that $t_{WS}$ =Nδ-(2X+1)T/2, where X refers to the subscript of $T_X$ above, and that both positive and negative window shifts $t_{WS}$ are available during the first time window $T_0$ with the composite range of phase shifts illustrated. With the illustrated composite range, it is apparent that the total delay Nδ may be increased to the point where the delayed data pulse 12 is delayed into the next time period $T_1$. The effect of this, however, is the same as if a delayed data pulse 12, normally occurring in the following time period $T_1$, had been advanced, i.e., moved from its 0 position at the center of the window in a direction opposite to the movement of the pulse, due to the increase in the delay.

Thus, there has been brought to the art of data recovery systems an improved data synchronizer wherein the phase of a data detection window clock signal may be set either exactly 180° relative to the phase of a string of data pulses or may be varied in phase relative to those pulses in precisely-variable increments over a wide range.

What is claimed is:

1. A disk drive data, synchronizer for deriving from an irregular series of data pulses in a pulse train having a given channel rate, window clock signals designating successive selectively-variable time periods, each of said window clock signals being dedicated to the discerning of the presence or absence of a respective one of said data pulses during a respective one of said time periods and to the synchronization of a discerned one of said data pulses, comprising:
    a) variable-frequency means for generating a first periodic clock signal whose nominal frequency is an integral multiple of the frequency of said pulse train and whose frequency is variable in response to a frequency-control signal;
    b) phase-shift means driven by said first periodic clock signal for generating second and third periodic clock signals in response to and at an integral submultiple of the frequency of said first clock signal, said second and third clock signals being phased apart from each other by a variable angle, said phase-shift means including a phase-shift control signal input;
    c) phase detector means for producing a phase detector signal representative of the sign and magnitude of the phase difference between said second clock signal and said data pulses, and means for applying the average of said phase detector signal to said variable-frequency means as its frequency-control signal, said variable-frequency means, phase-shift means, and phase detector forming a phase-locked loop;
    d) phase-shift control means for applying a control signal to said phase-shift control signal input and having a second phase-locked loop, said second phase-locked loop including a digital frequency divider therein; and
    e) data detector means responsive to said third clock signal and to said data pulses for discerning the presence or absence of a data pulse during each of said time periods and synchronizing said discerned data pulse with respect to said third clock signal.

2. The synchronizer of claim .1, wherein said phase angle is variable over a range which exceeds a full cycle of said third clock signal.

3. The synchronizer of claim 1 wherein said phase-shift means includes:
    a) a delay line having a control signal input;
    b) a plurality of stages, each producing a delay variable in response to a signal applied to said control signal input;
    c) means for connecting said clock signal input to receive said first periodic clock signal; and
    d) a plurality of outputs, each associated with one of said stages for tapping the progressive cumulative delays imposed on said first periodic clock signal by successive delay line stages, said second clock signal and said third clock signal being derived from different ones of said delay line outputs.

4. The synchronizer of claim 3, wherein said phase shift means additionally includes means for selectively accessing different ones of said delay line outputs for at least one of said second and third clock signals.

5. The synchronizer of claim 4, wherein one of said second and third clock signals is derived from a fixed delay line output representing the cumulative delay of X delay line stages, and the other of said second and third clock signals is derived from a selectable one of the remaining delay line outputs representing the cumulative delay of Y delay line stages, where Y is an integral multiple of X.

6. The synchronizer of claim 5, wherein X=1.

7. The synchronizer of claim 3, wherein each stage of said delay line imposes the same amount of incremental delay on a signal passing through the delay line stage and the respective delays individually imposed by said stages are uniformly variable.

8. The synchronizer of claim 7, wherein said phase-shift control means includes within said second phase-locked loop:
    a) frequency base means for generating a frequency base signal at a variable frequency;
    b) second variable-frequency means for generating a fourth clock signal whose frequency is variable in response to a frequency control signal;
    c) programmable frequency divider means responsive to said second variable-frequency means for producing a fifth clock signal whose frequency is a predetermined variable fraction of said fourth clock signal; and
    d) second phase-detector means for producing a second phase-detector signal in response to a phase difference between said frequency base signal and said fifth clock signal and means for applying the average of said second phase-detector signal to said second variable-frequency means as its frequency control signal and to the control signal input of said delay line.

9. The synchronizer of claim 8, wherein said frequency base means includes stable oscillator means for generating a standard signal at a given standard frequency and second programmable frequency divider means responsive to said stable oscillator means for applying to said frequency base input a signal whose frequency is a second predetermined variable fraction of said standard frequency.

10. The synchronizer of claim 8, wherein said delay line stages and said second variable-frequency means both comprise series-connected voltage-controlled inverters.

11. The synchronizer of claim 10, wherein the voltage-controlled inverters in said second variable-frequency means and in said delay line stages are identical.

12. The synchronizer of claim 3, wherein said multi-stage delay line stages comprise elements whose delay is variable by a control voltage, and wherein said synchronizer additionally includes:
   a) frequency base means for generating a frequency base signal at a variable frequency;
   b) second variable-frequency means for generating a fourth clock signal whose frequency is variable in response to a frequency control signal;
   c) programmable frequency divider means responsive to said second variable-frequency means for producing a fifth clock signal whose frequency is a predetermined variable fraction of said fourth clock signal; and
   second phase-detector means for producing a second phase-detector signal in response to a phase difference between said frequency base signal and said fifth clock signal and means for applying the average of said second phase-detector signal to said second variable-frequency means as its frequency control signal and to the control signal input of said delay line.

13. The synchronizer of claim 12, wherein said second variable frequency means comprises a ring oscillator having delay elements whose delay varies in response to changes in said second phase-detector signal in the same manner in which the delay elements of the delay line vary in response to the same signal.

14. The synchronizer of claim 13, wherein the delay elements of said second variable frequency means are identical to the delay elements of said delay line.

15. The synchronizer of claim 12, wherein said frequency base means includes stable oscillator means for generating a standard signal at a given standard frequency and a second programmable frequency divider means responsive to said stable oscillator means for applying to said second phase detector, as a frequency base signal, a signal whose frequency is a predetermined variable fraction of said standard frequency.

16. The synchronizer of claim 1, wherein said variable-frequency means is phase-locked to said data pulses to operate at twice said channel rate, and wherein there is additionally provided a symmetric window generator responsive to said variable-frequency means to produce first and second window clock signals at said channel rate precisely 180° out of phase with each other, and means for alternatively applying either said first and second window clock signals or said second and third clock signals to said phase detector means and to said data detector means, respectively.

17. The synchronizer of claim 16, wherein said window generator comprises an integrated circuit having a line of symmetry separating substantially identical halves of said window generator, each half having an output on which is carried a respective one of said first and second window clock signals.

18. The synchronizer of claim 17, wherein each half of said window generator comprises a respective one of a pair of cross-connected logic gates and a feedback loop connected between the output of said cross-connected logic gate and its input.

19. The synchronizer of claim 18, wherein said window generator has first and second mutually-exclusive states and each said feedback loop includes means for conditionally enabling it during portions of the times during which respective ones of said states prevail.

20. The synchronizer of claim 16, wherein said window generator is connected between the output of said variable-frequency means and an input of said phase-shift means to cause a clock signal at half the frequency of said first periodic clock signal to be applied as an input to said phase-shift means.

21. In a disk drive data synchronizer for deriving from an irregular series of data pulses in a pulse train having a given channel rate, window clock signals designating successive variable time windows comprising the combination of:
   a) a first phase-locked loop including:
      i) first phase detector means, having a pair of inputs, for producing a first phase-error signal as a function of the phase difference between signals on said inputs;
      ii) first variable-frequency means responsive to said first phase detector means for generating a first output signal whose frequency is a function of said first phase-error signal; and
      iii) phase shift means for deriving from said first output signal two delayed output signals, at least one of them shifted in phase relative to said first output signal by a variable amount determined by a control signal, one of said delayed output signals being applied to one input of said first phase-detector means and the other serving as said window clock signals;
   b) a second phase-locked loop including:
      i) second phase detector means, having a pair of inputs, for producing a second phase-error signal as a function of the phase difference between signals on said inputs;
      ii) second variable-frequency means responsive to said second phase detector means for generating a second output signal whose frequency is a function of said second phase-error signal; and
      iii) divider means responsive to said second variable-frequency means for applying to one input of said second phase-detector means a signal at a frequency which is an integral sub-multiple of the frequency of said second output signal;
   c) means for applying said second phase-error signal to said phase shift means as its said control signal;
   d) means for applying said data pulses to the other input of said first phase-detector means; and
   e) means for applying a source of constant-frequency signals to the other input of said second phase-detector means.

22. The synchronizer of claim 21, wherein said phase shift means comprises a multi-stage delay line having an input connected to be driven by said first output signal and a plurality of outputs for tapping the progressive cumulative delays imposed on said first output signal by successive delay line stages, one of said delay line outputs serving as a source of clock signals to said first phase-detector means and the other serving as the source of said window clock signal.

23. The synchronizer of claim 22, wherein said phase shift means additionally comprises means for selectively accessing different ones of said delay line outputs to serve as a source for said first phase-detector means.

24. The system of claim 23, wherein the first of said delay line stages produces a clock signal delayed by a variable time $\delta$ relative to said first output signal, and the remaining delay line stages respectively produce a series of clock signals delayed in time by 2δ, 3δ, . . . [N+1]δ respectively, where N is a positive integer.

25. The synchronizer of claim 24, wherein said second variable-frequency means and said multi-stage delay line each comprise a plurality of voltage-controlled variable-delay elements controlled by said second phase-error signal, the characteristics of the voltage-controlled elements of said delay line matching the characteristics of the voltage-controlled elements of said second variable-frequency means.

26. The synchronizer of claim 22, wherein one of said delay output signals is derived from a fixed delay line output representing the cumulative delay of X delay line stages and the other is derived from a selectable one of the remaining delay line outputs representing the cumulative delay of Y delay line stages where Y is an integral multiple of X.

27. The synchronizer of claim 26, wherein X equals 1.

28. The synchronizer of claim 22, wherein each stage of said delay line imposes the same amount of incremental delay on a signal passing through the delay line stage and the respective delays individually imposed by said stages are uniformly variable in unison.

29. The synchronizer of claim 28, wherein said delay line includes means for applying said second phase-error signal as a control voltage input to each of said delay line stages and the delay imposed by said delay line stages is uniformly variable by means of said control voltage input.

30. The synchronizer of claim 29, wherein said divider means comprises programmable frequency divider means responsive to said second variable-frequency means for applying to said one input of said second phase-detector means a clock signal whose frequency is a predetermined variable fraction of the frequency of said second output signal.

31. The synchronizer of claim 30, wherein said means for applying a source of constant frequency signals includes stable oscillator means for generating a standard signal at a given standard frequency and second programmable frequency divider means responsive to said stable oscillator means for applying to said other input of said second phase-detector means a signal whose frequency is a second predetermined variable fraction of said standard frequency.

32. The synchronizer of claim 22, wherein said delay line stages and said second variable-frequency controlled inverters responsive to said second phase-error signal.

33. The synchronizer of claim 32, wherein said divider means includes a programmable frequency divider and said source of constant-frequency signals includes stable oscillator means for generating a standard signal at a given standard frequency and a second programmable frequency divider responsive to said stable oscillator means for applying to said other input of said second phase-detector means a signal whose frequency is a predetermined variable fraction of said standard frequency.

34. In a disk drive data synchronizer for deriving from an irregular series of data pulses in a pulse train having a given channel rate, a window clock signal designating successive time windows comprising the combination of:
a) a first phase-locked loop including:
   i) first phase detector means, having a pair of inputs, for producing a first phase-error signal as a function of the phase difference between signals on said inputs;
   ii) first variable-frequency means responsive to said first phase detector means for generating a first output signal whose frequency is a function of said first phase-error signal; and
   iii) a multi-stage delay line having:
      aa) a first plurality of voltage-controlled variable-delay elements;
      bb) an input responsive to said first output signal; and
      cc) a plurality of outputs, one from each stage of said delay line;
   iv) means for deriving said window clock signal from a selected one of said delay line outputs; and
   v) means for applying the signal on a selected one of the remaining delay line outputs to one input of said first phase-detector means;
b) a second phase-locked loop including:
   i) second phase detector means, having a pair of inputs, for producing a second phase-error signal as a function of the phase difference between signals on said inputs;
   ii) second variable-frequency means having a second plurality of voltage-controlled variable-delay elements connected as a ring oscillator responsive to said second phase detector means for generating a second output signal whose frequency is a function of said second phase-error signal; and
   iii) divider means responsive to said second variable-frequency means for applying to one input of said second phase-detector means a signal at a frequency which is an integral sub-multiple of the frequency of said second output signal;
c) means for applying said second phase-error signal to said first plurality of voltage-controlled elements as their control voltage;
d) means for applying said data pulses to the other input of said first phase-detector means; and
e) means for applying a source of constant-frequency signals to the other input of said second phase-detector means.

35. The synchronizer of claim 34, wherein each of said first and second pluralities- or variable-delay elements is a voltage-controlled inverter, the characteristics of the voltage-controlled inverters of said second plurality matching the characteristics of the voltage-controlled inverters of said first plurality.

36. The synchronizer of claim 34, wherein said means for applying the signal on a selected one of the remaining delay line outputs is a multiplexer.

* * * * *

UNITED STATES PATENT AND TRADEMARK OFFICE
CERTIFICATE OF CORRECTION

PATENT NO. : 5,212,601

DATED : May 18, 1993

INVENTOR(S) : Ronald E. Wilson

It is certified that error appears in the above-identified patent and that said Letters Patent is hereby corrected as shown below:

Column 5, line 42, change "10" to -- $10^{10}$ --.

Column 6, line 30, before "the present" insert -- assigned to --.

Column 8, line 1, after "5d," insert -- 5e, --.

Column 9, line 15, after "data" insert -- 12 --.

Column 10, line 11, change "N3 and N" to -- N3 and N4 --.
Column 10, lines 16,17, delete the spaces between lines 16 and 17.
Column 10, line 25, change "n2" to -- N2 --.
Column 10, line 31, change "n1" to -- N1 --.
Column 10, line 52, change "Pl" to -- P1 --.
Column 10, line 53, change "Pl" to -- P1 --.
Column 10, line 59, change "Pl" to -- P1 --.
Column 10, line 62, change "Ql" to -- Q1 --.
Column 10, line 63, change "Pl" to -- P1 --.

Column 12, line 20, change "l5" to -- I5 --.
Column 12, line 50, change "l5" to -- I5 --.
Column 12, line 62, change "Pl" to -- P1 --.
Column 12, line 67, change "l5" to -- I5 --.

Column 13, line 13, change "FIG." to -- FIGS. --.
Column 13, line 28, change "ut" to -- put --.
Column 13, lines 42,43, change "tot he" to -- to the --.

UNITED STATES PATENT AND TRADEMARK OFFICE
CERTIFICATE OF CORRECTION

PATENT NO.  : 5,212,601
DATED       : May 18, 1993
INVENTOR(S) : Ronald E. Wilson It is certified that error appears in the above-identified patent and that said Letters Patent is hereby corrected as shown below:

```
Column 14, line 29, change "phase-means" to -- phase-shift
          means --.

Column 16, line 29, change "has not to -- has no --.

Column 17, line 1,  change "δ" to -- δ₀ --.
Column 17, line 13, change "δ" to -- δ₀ --.

Column 18, line 8,  change "δ- δ_N δ_N" to -- δ₀-δ_N --.
```

In the Claims

```
Column 19, line 30, after "data" delete the comma.

Column 20, line 3, before "1" delete the period.

Column 21, line 20, before "second" insert -- d) --.

Column 23, line 50, after "frequency" insert -- means
          comprise identical series-connected voltage --.
```

Signed and Sealed this

First Day of March, 1994

Attest:

BRUCE LEHMAN

*Attesting Officer*    Commissioner of Patents and Trademarks